(12) United States Patent
Yamada

(10) Patent No.: US 12,506,043 B2
(45) Date of Patent: Dec. 23, 2025

(54) SEMICONDUCTOR DEVICE

(71) Applicant: FUJI ELECTRIC CO., LTD., Kawasaki (JP)

(72) Inventor: Takafumi Yamada, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 564 days.

(21) Appl. No.: 17/848,645

(22) Filed: Jun. 24, 2022

(65) Prior Publication Data

US 2023/0067156 A1 Mar. 2, 2023

(30) Foreign Application Priority Data

Aug. 27, 2021 (JP) ................. 2021-139026

(51) Int. Cl.
*H01L 23/367* (2006.01)
*H01L 23/053* (2006.01)
*H01L 23/24* (2006.01)
*H01L 23/40* (2006.01)
*H01L 23/485* (2006.01)

(52) U.S. Cl.
CPC .......... *H01L 23/3675* (2013.01); *H01L 23/40* (2013.01); *H01L 23/485* (2013.01)

(58) Field of Classification Search
CPC ... H01L 23/3675; H01L 23/40; H01L 23/485; H01L 23/4821; H01L 23/4822; H01L 23/4824; H01L 23/4825
See application file for complete search history.

(56) References Cited

U.S. PATENT DOCUMENTS

| 11,587,797 B2 * | 2/2023 | Mafune ................. H01L 23/053 |
| 2013/0135824 A1 | 5/2013 | Harubeppu et al. |
| 2019/0067214 A1 | 2/2019 | Sato |

(Continued)

FOREIGN PATENT DOCUMENTS

| EP | 2600399 A2 | 6/2013 |
| JP | 2004-228286 A | 8/2004 |
| JP | 2005-191178 A | 7/2005 |

(Continued)

OTHER PUBLICATIONS

Japanese Office Action issued on Apr. 15, 2025, for corresponding Japanese Patent Application No. 2021-139026.

*Primary Examiner* — Dale E Page
*Assistant Examiner* — Cristian A Tivarus
(74) *Attorney, Agent, or Firm* — Rabin & Berdo, P.C.

(57) ABSTRACT

A semiconductor device includes a semiconductor chip, an insulated circuit board on which the semiconductor chip is disposed, a cooling plate having a second front surface to which the insulated circuit board is disposed, a bonding member which bonding the insulated circuit board to the cooling plate, a case which surrounds the semiconductor chip and the insulated circuit board and is bonded to the second front surface of the cooling plate with an adhesive therebetween and a sealing member which seals the semiconductor chip and the insulated circuit board over the cooling plate in the case. The cooling plate has a coupling portion which is a projection or a recess at the second front surface of the cooling plate, and the coupling portion has an engaging surface that is inclined to form an acute angle with the second front surface of the cooling plate.

19 Claims, 13 Drawing Sheets

(56) References Cited

U.S. PATENT DOCUMENTS

2020/0161145 A1* 5/2020 Mafune ................ H02M 7/003

FOREIGN PATENT DOCUMENTS

| JP | 2005353945 | A | * | 12/2005 |
| JP | 2012204366 | A | * | 10/2012 |
| JP | 2013-115297 | A | | 6/2013 |
| JP | 2019-040971 | A | | 3/2019 |
| JP | 2021086869 | A | | 6/2021 |

* cited by examiner

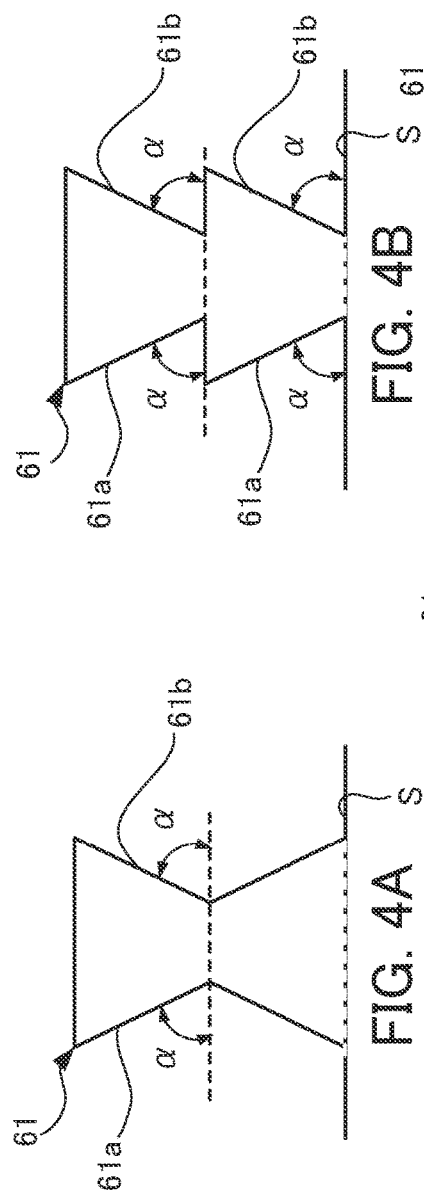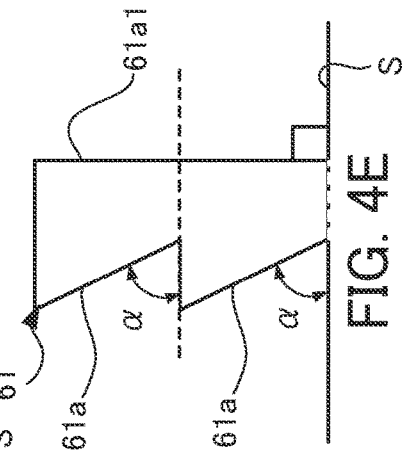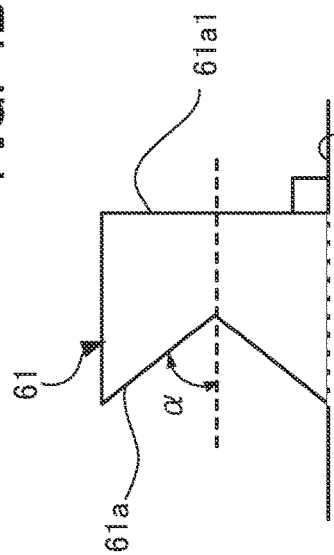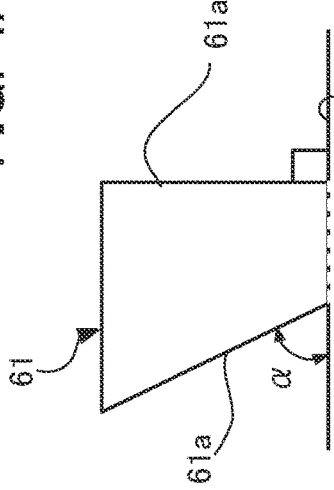

SEMICONDUCTOR DEVICE

CROSS-REFERENCE TO RELATED APPLICATION

This application is based upon and claims the benefit of priority of the prior Japanese Patent Application No. 2021-139026, filed on Aug. 27, 2021, the entire contents of which are incorporated herein by reference.

BACKGROUND OF THE INVENTION

1. Field of the Invention

The embodiments discussed herein relate to a semiconductor device.

2. Background of the Related Art

Semiconductor devices include power devices and are used as power converters. The power devices are insulated gate bipolar transistors (IGBTs), power metal oxide semiconductor field effect transistors (MOSFETs), and the like. Furthermore, with such a semiconductor device, semiconductor chips including power devices and an insulated circuit board arranged over a cooling plate made of metal are housed in a case and the inside of the case is sealed with a sealing member.

Japanese Laid-open Patent Publication No. 2013-115297

With a semiconductor device stress is created due to the difference in linear expansion coefficient between members included in the semiconductor device as a result of temperature cycling. In particular, a great stress is applied to an interface between a cooling plate and a sealing member. As a result, the sealing member peels off the cooling plate. If the sealing member peels off the cooling plate, then moisture may enter from a peeling part. As a result, the insulating property of a semiconductor chip, an insulated circuit board, or the like is not maintained.

SUMMARY OF THE INVENTION

According to an aspect, there is provided a semiconductor device including a semiconductor chip; an insulated circuit board including an insulating plate, a circuit pattern disposed on a first front surface of the insulating plate, and a metal plate disposed on a back surface of the insulating plate, the semiconductor chip being disposed on the first front surface of the insulating plate; a cooling plate having a second front surface on which the insulated circuit board is disposed; a bonding member which bonds the insulated circuit board to the cooling plate; a case which is disposed along an outer edge portion of the second front surface of the cooling plate to surround the semiconductor chip and the insulated circuit board, and is bonded to the cooling plate by an adhesive therebetween; and a sealing member which seals the semiconductor chip and the insulated circuit board on the cooling plate in the case, wherein the cooling plate has a coupling portion which is a projection or a recess disposed at the second front surface of the cooling plate, the coupling portion having an engaging surface that is inclined to form an acute angle with the second front surface of the cooling plate.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 4A through 4G are views of a coupling portion included in modification 1-1 of the semiconductor device according to the first embodiment;

DETAILED DESCRIPTION OF THE INVENTION

Figure 1:
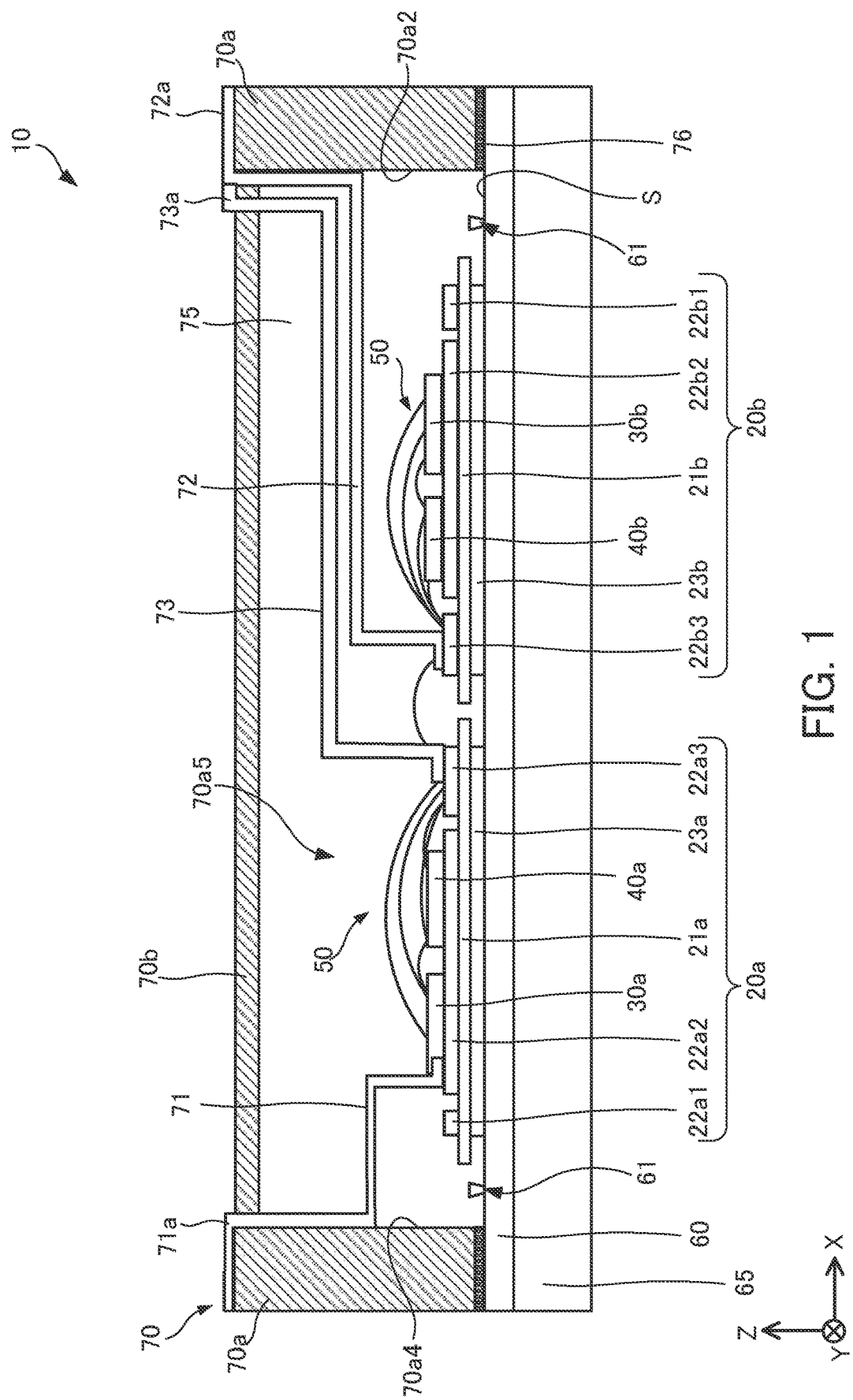
FIG. 1 is a sectional side elevation view of a semiconductor device according to a first embodiment.

Embodiments will now be described by reference to the accompanying drawings. In the following description a "front surface" and an "upper surface" indicate a surface of a semiconductor device 10 of FIG. 1 which faces the upper side. Similarly, an "upside" indicates the upward direction of the semiconductor device 10 illustrated in the drawings. A "back surface" and a "lower surface" indicate a surface of the semiconductor device 10 illustrated in the drawings which faces the lower side. Similarly, a "downside" indicates the downward direction of the semiconductor device 10 illustrated in the drawings. These terms mean the same directions at need in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" and the "downside" do not always mean the vertical direction relative to the ground. That is to say, directions indicated by the "upside" and the "downside" are not limited to the gravity direction.

First Embodiment

Figure 2:
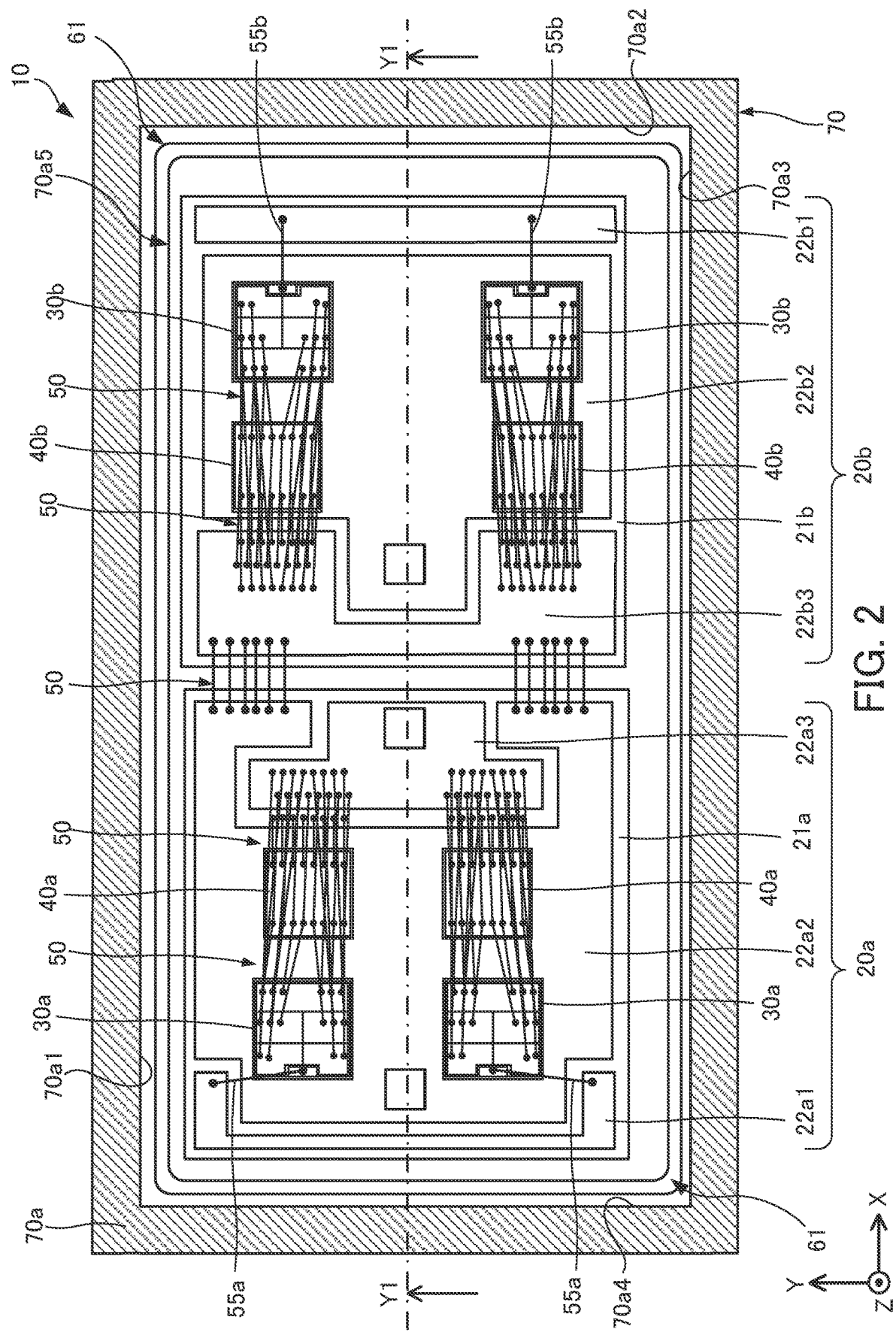
FIG. 2 is a plan view of the semiconductor device according to the first embodiment.

A semiconductor device according to a first embodiment will be described by the use of FIG. 1 and FIG. 2. FIG. 1 is a sectional side elevation view of a semiconductor device according to a first embodiment. FIG. 2 is a plan view of the semiconductor device according to the first embodiment. FIG. 1 is a sectional view taken along the dot-dash line Y1-Y1 of FIG. 2. Furthermore, FIG. 2 does not illustrate a sealing member 75 of the semiconductor device 10.

As illustrated in FIG. 1, the semiconductor device 10 includes insulated circuit boards 20a and 20b and a cooling plate 60 over which the insulated circuit boards 20a and 20b are located with a solder 23 (see FIG. 3) therebetween. As illustrated in FIG. 2, semiconductor chips 30a and 40a and semiconductor chips 30b and 40b are bonded directly to the insulated circuit boards 20a and 20b, respectively, with solders (not illustrated). Furthermore, the semiconductor device 10 includes a case 70 (frame portion 70a) which is located over a peripheral edge portion of the cooling plate 60 with an adhesive 76 therebetween and which surrounds the insulated circuit boards 20a and 20b. In addition, lead frames 71, 72, and 73 are fixed to the case 70 (lid portion 70b). One end of the lead frame 71 is connected directly (electrically and mechanically) to the insulated circuit board 20a and the other end of the lead frame 71 is exposed on the case 70 as a terminal 71a. One end of the lead frame 72 is connected directly to the insulated circuit board 20b and the other end of the lead frame 72 is exposed on the case 70 as a terminal 72a. One end of the lead frame 73 is connected directly to the insulated circuit board 20a and the other end of the lead frame 73 is exposed on the case 70 as a terminal 73a. Moreover, the insulated circuit boards 20a and 20b in the case 70 are sealed with the sealing member 75.

The insulated circuit boards 20a and 20b are rectangular in plan view. Furthermore, as illustrated in FIGS. 1 and 2, the insulated circuit board 20a includes an insulating plate 21a, circuit patterns 22a1 through 22a3 formed over the front surface of the insulating plate 21a, and a metal plate 23a formed on the back surface of the insulating plate 21a. As illustrated in FIGS. 1 and 2, the insulated circuit board 20b includes an insulating plate 21b, circuit patterns 22b1 through 22b3 formed over the front surface of the insulating plate 21b, and a metal plate 23b formed on the back surface of the insulating plate 21b. The shape and quantity of the circuit patterns 22a1 through 22a3 and 22b1 through 22b3 are taken as an example.

The insulating plates 21a and 21b are rectangular in plan view. Furthermore, corner portions of the insulating plates 21a and 21b may be chamfered. For example, the corner portions of the insulating plates 21a and 21b may be C-chamfered or R-chamfered. The insulating plates 21a and 21b are made of a ceramic having high thermal conductivity. Such a ceramic is made of a material which contains as a main component aluminum oxide, aluminum nitride, silicon nitride, or the like. In addition, the thickness of the insulating plates 21a and 21b is greater than or equal to 0.2 mm and smaller than or equal to 2.0 mm.

The circuit patterns 22a1 through 22a3 and 22b1 through 22b3 are formed over the entire surfaces except edge portions of the insulating plates 21a and 21b respectively. End portions of the circuit patterns 22a1 through 22a3 and 22b1 through 22b3 which face the outer peripheries of the insulating plates 21a and 21b are preferably superimposed in plan view on end portions of the metal plates 23a and 23b on the sides of the outer peripheries of the insulating plates 21a and 21b respectively. Accordingly, with the insulated circuit boards 20a and 20b stress balance is maintained between the circuit patterns 22a1 through 22a3 and 22b1 through 22b3 and the metal plates 23a and 23b formed on the back surfaces of the insulating plates 21a and 21b respectively. This suppresses an excessive warp of the insulating plate 21a or 21b or damage, such as a crack, to the insulating plate 21a or 21b. Squares on the circuit patterns 22a2, 22b2, and 22a3 indicate areas to which the lead frames 71, 72, and 73, respectively, are connected.

The circuit pattern 22a1 has the shape of the letter "U" in plan view and is formed over a central portion of an edge portion (on the −X direction side) of the insulating plate 21a. An opening of the circuit pattern 22a1 faces the +X direction. The circuit pattern 22a2 has the shape of the letter "U" in plan view and is formed over a central portion of the insulating plate 21a. An opening which is open in the +X direction is formed in an edge portion (on the +X direction side) of the circuit pattern 22a2. Furthermore, a protrusion protruding in the −X direction is formed in an edge portion (on the −X direction side) of the circuit pattern 22a2. The protrusion of the circuit pattern 22a2 fits into the opening of the circuit pattern 22a1. One end of the lead frame 71 is bonded on the −X direction side of the circuit pattern 22a2. The circuit pattern 22a3 has the shape of the letter "T" in plan view and is formed over an edge portion (on the +X direction side) of the insulating plate 21a. The circuit pattern 22a3 is formed in the opening of the circuit pattern 22a2. A protrusion of the circuit pattern 22a3 is exposed in the +X direction from the opening of the circuit pattern 22a2. One end of the lead frame 73 is bonded on the +X direction side of the circuit pattern 22a3.

The circuit pattern 22b1 has the shape of the letter "I" in plan view and is formed over a central portion of an edge portion (on the +X direction side) of the insulating plate 21b in the ±Y direction of the insulating plate 21b. The circuit pattern 22b2 has the shape of the letter "T" in plan view and is formed adjacent to the circuit pattern 22b1 over the insulating plate 21b. Furthermore, the circuit pattern 22b2 protrudes in the −X direction. The circuit pattern 22b3 has the shape of the letter "U" in plan view and is formed over a central portion of an edge portion (on the −X direction side) of the insulating plate 21b. One end of the lead frame 72 is bonded to a protrusion of the circuit pattern 22b2. An opening of the circuit pattern 22b3 faces the +X direction. The protrusion of the circuit pattern 22b2 fits into the opening of the circuit pattern 22b3.

Furthermore, the thickness of the circuit patterns 22a1 through 22a3 and 22b1 through 22b3 is greater than or equal to 0.1 mm and smaller than or equal to 2.0 mm. The circuit patterns 22a1 through 22a3 and 22b1 through 22b3 are made of metal, such as copper, aluminum, or an alloy containing at least one of them, having good electrical conductivity. In addition, in order to improve corrosion resistance, plating treatment may be performed on the surfaces of the circuit patterns 22a1 through 22a3 and 22b1 through 22b3. At this time nickel, a nickel-phosphorus alloy, a nickel-boron alloy or the like is used as a plating material. The circuit patterns 22a1 through 22a3 and 22b1 through 22b3 are formed over the insulating plates 21a and 21b, respectively, in the following way. A metal layer is formed over the front surfaces of the insulating plates 21a and 21b and treatment, such as etching, is performed on the metal layer. By doing so, the circuit patterns 22a1 through 22a3 and 22b1 through 22b3 are obtained. Alternatively, the circuit patterns 22a1 through 22a3 and 22b1 through 22b3 cut in advance out of a metal plate may be pressure-bonded to the front surfaces of the insulating plates 21a and 21b respectively. The circuit patterns 22a1 through 22a3 and 22b1 through 22b3 are taken as an example. The number, shape, size, or the like of circuit patterns may be properly selected at need.

The metal plates 23a and 23b are rectangular in plan view. Furthermore, corner portions of the metal plates 23a and 23b may be chamfered. For example, the corner portions of the metal plates 23a and 23b may be C-chamfered or R-chamfered. The metal plates 23a and 23b are smaller in size than the insulating plates 21a and 21b respectively and are formed on the entire back surfaces except edge portions of the insulating plates 21a and 21b respectively. Each of the metal plates 23a and 23b contains as a main component metal having high thermal conductivity. Such metal is copper, aluminum, an alloy containing at least one of them, or the like. In addition, the thickness of the metal plates 23a and 23b is greater than or equal to 0.1 mm and smaller than or equal to 2.0 mm. In order to improve the corrosion resistance of the metal plates 23a and 23b, plating treatment may be performed. At this time nickel, a nickel-phosphorus alloy, a nickel-boron alloy, or the like is used as a plating material.

Direct copper bonding (DCB) substrates, active metal brazed (AMB) substrates, or the like may be used as the insulated circuit boards 20a and 20b each having the above structure. The insulated circuit boards 20a and 20b conduct heat generated by the semiconductor chips 30a and 40a and semiconductor chips 30b and 40b via the circuit patterns 22a2 and 22b2, the insulating plates 21a and 21b, and the metal plates 23a and 23b, respectively, to the lower side in FIG. 1 in order to dissipate the heat.

Each of the semiconductor chips 30a, 30b, 40a, and 40b includes a power device element made of silicon, silicon carbide, or gallium nitride. For example, the thickness of the semiconductor chips 30a, 30b, 40a, and 40b is greater than or equal to 40 µm and smaller than or equal to 250 µm. The semiconductor chips 30a and 30b, which are power device elements, are switching elements and the semiconductor chips 40a and 40b, which are power device elements, are diode elements. The semiconductor chips 30a and 30b, which are switching elements, are IGBTs, power MOSFETs, or the like. For example, each of the semiconductor chips 30a and 30b has a drain electrode (or a collector electrode) as a main electrode on the back surface and has a gate electrode as a control electrode and a source electrode (or an emitter electrode) as a main electrode on the front surface.

The semiconductor chips 40a and 40b, which are diode elements, are freewheeling diodes (FWDs) such as Schottky barrier diodes (SBDs) or P-intrinsic-N (PiN) diodes. Each of the semiconductor chips 40a and 40b has a cathode electrode as a main electrode on the back surface and has an anode electrode as a main electrode on the front surface.

Furthermore, a reverse-conducting (RC)-IGBT having the functions of an IGBT and an FWD may be used as each of the semiconductor chips 30a, 30b, 40a, and 40b. In this case, each semiconductor chip has an output electrode, which is an emitter electrode, and a control electrode, which is a gate electrode, on the front surface and has an input electrode (not illustrated), which is a collector electrode, on the back surface.

The following wires 50 are wired on the insulated circuit boards 20a and 20b and the semiconductor chips 30a, 30b, 40a, and 40b. In FIGS. 1 and 2, wires connecting components, other than control wirings, are generically named wires 50. Wires 55a and 55b, which are the control wirings, are electrically connected to the circuit patterns 22a1 and 22b1 and gates of the semiconductor chips 30a and 30b respectively. Electrical connections are properly made by the other wires 50 between the semiconductor chips 30a and 40a and the circuit pattern 22a3 and between the semiconductor chips 30b and 40b and the circuit pattern 22b3. The wires 50, 55a, and 55b are made of metal, such as aluminum, copper, or an alloy containing at least one of them, having good electrical conductivity. Furthermore, it is desirable that the diameter of the wires 50, 55a, and 55b be greater than or equal to 100 µm and smaller than or equal to 1.00 mm.

Each of the lead frames 71, 72, and 73 contains as a main component a material, such as aluminum, iron, silver, copper, or an alloy containing at least one of them, having good electrical conductivity. Furthermore, in order to improve corrosion resistance, plating treatment may be performed on the surfaces of the lead frames 71, 72, and 73. At this time nickel, a nickel-phosphorus alloy, a nickel-boron alloy, or the like is used as a plating material. The one end of the lead frame 71 is bonded directly to the circuit pattern 22a2 and the other end of the lead frame 71 is exposed from an edge portion (on the −X direction side) of the lid portion 70b. The one end of the lead frame 72 is bonded directly to the circuit pattern 22b3 and the other end of the lead frame 72 is exposed from an edge portion (on the +X direction side) of the lid portion 70b. The one end of the lead frame 73 is bonded directly to the circuit pattern 22a3 and the other end of the lead frame 73 is exposed from the edge portion (on the +X direction side) of the lid portion 70b. The one end of the lead frame 71, the one end of the lead frame 72, and the one end of the lead frame 73 are bonded to the circuit patterns 22a2, 22b3, and 22a3, respectively, with solders (not illustrated). The one end of the lead frame 71, the one end of the lead frame 72, and the one end of the lead frame 73 may be bonded directly to the circuit patterns 22a2, 22b3, and 22a3, respectively, by laser welding or ultrasonic bonding in place of the solders.

Pb-free solders are used for all of the solders described above. A Pb-free solder contains as a main component an alloy containing at least two of tin, silver, copper, zinc, antimony, indium, bismuth, and the like. Furthermore, the solders may contain an additive such as nickel, germanium, cobalt, or silicon. The solders containing an additive improve wettability, a gloss, and bonding strength and reliability is improved. In addition, a sintered metal body may be used in place of each solder. Metal used as the sintered metal body is silver, a silver alloy, or the like.

The cooling plate 60 is rectangular in plan view. Furthermore, the thickness of the cooling plate 60 is greater than or equal to 0.5 mm and smaller than or equal to 5.0 mm and is, for example, approximately 1.0 mm. The cooling plate 60 contains as a main component metal having high thermal conductivity. Such metal is copper, aluminum, an alloy containing at least one of them, or the like. In order to improve the corrosion resistance of the cooling plate 60, plating treatment may be performed. At this time nickel, a nickel-phosphorus alloy, a nickel-boron alloy, or the like is used as a plating material. Furthermore, the back surfaces of the metal plates 23a and 23b of the insulated circuit boards 20a and 20b are bonded to a front surface S of the cooling plate 60 with the solder 23 (see FIG. 3). The solder 23 is as described above. Alternatively, a sintered metal body may be used.

Furthermore, a coupling portion 61 is formed on the front surface S of the cooling plate 60. The coupling portion 61 is continuously formed on the front surface S of the cooling plate 60 along the frame portion 70a of the case 70. The coupling portion 61 is loop-shaped and surrounds the insulated circuit boards 20a and 20b. That is to say, the coupling portion 61 is formed in side view between the frame portion 70a of the case 70 and outer edge portions of the insulated circuit boards 20a and 20b. Corner portions of the coupling portion 61 may be R-chamfered in plan view. The details of the coupling portion 61 will be described later.

A cooler 65 may be fixed to the back surface of the cooling plate 60 with a solder, a brazing filler metal, or a thermal interface material therebetween to improve the heat dissipation property. For example, the cooler 65 contains as a main component a material, such as aluminum, iron, silver, copper, or an alloy containing at least one of them, having high thermal conductivity. Furthermore, a fin, a heat sink made up of a plurality of fins, a water-cooling cooler, or the like may be used as the cooler 65. In addition, the cooling plate 60 and the cooler 65 may be integrally formed. In that case, the cooling plate 60 and the cooler are made of aluminum, iron, silver, copper, or an alloy containing at least one of them which has high thermal conductivity. Moreover, in order to improve corrosion resistance, plating treatment may be performed. At this time nickel, a nickel-phosphorus alloy, a nickel-boron alloy, or the like is used as a plating material.

Furthermore, the brazing filler metal contains as a main component at least one of an aluminum alloy, a titanium alloy, a magnesium alloy, a zirconium alloy, a silicon alloy, and the like. If the brazing filler metal is used, then the cooler 65 is bonded to a determined area of the back surface of the cooling plate 60 by brazing. The thermal interface material is a generic name for various materials such as a thermally conductive grease, an elastomer sheet, room temperature vulcanization (RTV) rubber, gel, and a phase change material. Grease is, for example, silicone with which a metal oxide filler is mixed.

The case 70 includes the frame portion 70a and the lid portion 70b. The frame portion 70a has the shape of a frame in plan view. The frame portion 70a surrounds a housing area 70a5 in order by inner wall surfaces 70a1, 70a2, 70a3, and 70a4. The frame portion 70a is located over an outer edge portion of the cooling plate 60 with the adhesive 76 therebetween so as to surround the insulated circuit boards 20a and 20b. The adhesive 76 contains as a main component an organic adhesive. The heat-resistant temperature of an organic adhesive is approximately 100 to 200° C. To be concrete, an organic adhesive is an epoxy type adhesive, a silicone type adhesive, or an acrylic type adhesive. Furthermore, the adhesive 76 may be an adhesive in paste or sheet form. The lid portion 70b is fixed to the frame portion 70a so as to cover an opening of the frame portion 70a. In addition, the other ends of the lead frames 71, 72, and 73 are exposed from the lid portion 70b.

The above case 70 is made of resin. Such resin contains as a main component a thermoplastic resin such as polyphenylene sulfide resin, polybutylene terephthalate resin, polybutylene succinate resin, polyamide resin, or acrylonitrile butadiene styrene resin. The frame portion 70a is formed by filling a determined metal mold with such resin, solidifying it, and removing the metal mold. Furthermore, the lid portion 70b is formed in the same way separately from the frame portion 70a. When the lid portion 70b is formed, the following method may be used. The lead frames 71, 72, and 73 are set in a determined metal mold, the metal mold is filled with resin, and the resin is solidified. By doing so, the lid portion 70b and the lead frames 71, 72, and 73 are integrally molded.

The inside of the case 70 is sealed with the sealing member 75 to a level at which the insulated circuit boards 20a and 20b, the semiconductor chips 30a, 30b, 40a, and 40b, the wires 50, and the lead frames 71, 72, and 73 in the case 70 are sealed. As described later, at this time the coupling portion 61 is also sealed with the sealing member 75. The sealing member 75 contains a thermosetting resin and a filling material contained as a filler in a thermosetting resin. Such a thermosetting resin is epoxy resin, phenolic resin, maleimide resin, or the like. Such a filling material is glass, silicon dioxide, aluminum oxide, boron nitride, or aluminum nitride, or the like. An example of the sealing member 75 contains epoxy resin and a filling material. At least one of the above filling materials is used as a filler.

Figure 3:
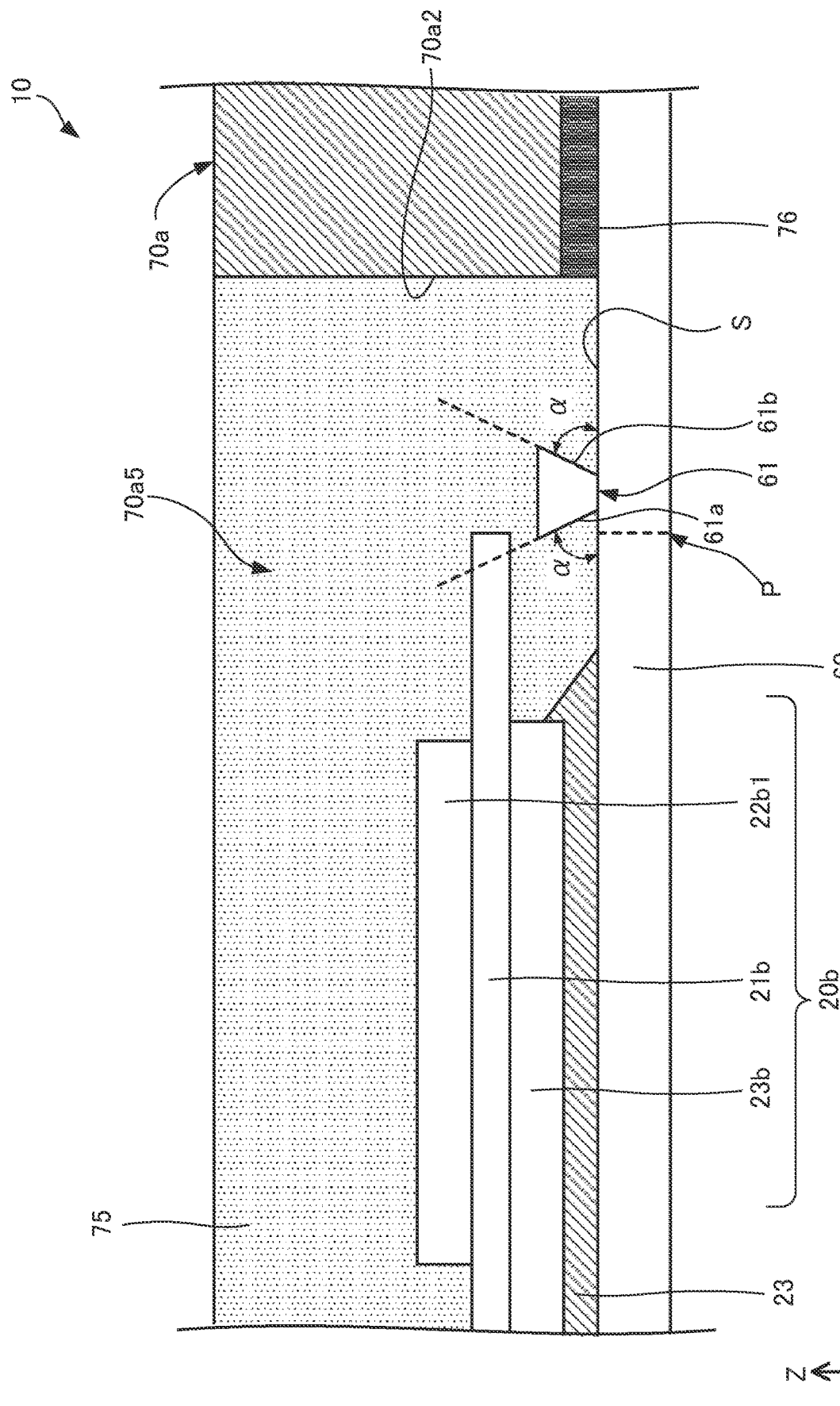
FIG. 3 is a fragmentary sectional side elevation view of the semiconductor device according to the first embodiment.

The details of the coupling portion 61 will now be described by the use of FIG. 3. FIG. 3 is a fragmentary sectional side elevation view of the semiconductor device according to the first embodiment. FIG. 3 is an enlarged view of the vicinities of the coupling portion 61 adjacent to the inner wall surface 70a2 of the frame portion 70a illustrated in FIG. 1. The relationship between the coupling portion 61 and the insulated circuit board 20b will be described. However, the same applies to the insulated circuit board 20a.

The coupling portion 61 may be surrounded by a plurality of surfaces. The coupling portion 61 includes engaging surfaces 61a and 61b (corresponding to first and second engaging surfaces respectively) which form a projection on the front surface S of the cooling plate 60 and which are inclined at an acute angle to the front surface S of the cooling plate 60. At least one of the engaging surfaces 61a and 61b of the coupling portion 61 need only be inclined. In the case of FIG. 3, the engaging surfaces 61a and 61b are inclined at the same angle (inclination angle α) to the front surface S of the cooling plate 60.

A section of the coupling portion 61 is as follows. The engaging surfaces 61a and 61b are inclined to the front surface S of the cooling plate 60 and form the shape of an inverted trapezoid. The inverted trapezoid has an upper base longer than a lower base. The engaging surfaces 61a and 61b of the coupling portion 61 connect the upper base and the lower base.

The engaging surface 61a faces the insulated circuit board 20b and the engaging surface 61b (side portion of the coupling portion 61) faces the inner wall surface 70a2 of the frame portion 70a. Furthermore, the engaging surfaces 61a and 61b are inclined at the inclination angles α to the front surface S of the cooling plate 60. The inclination angles α are preferably greater than or equal to 45° and less than or equal to 80°. In addition, because the inclination angles α of the engaging surfaces 61a and 61b are equal, the coupling portion 61 has the shape of an inverted trapezoid. As long as the inclination angles α of the engaging surfaces 61a and 61b are acute angles, they may be different from each other. In this case, a section of the coupling portion 61 does not always have the shape of an inverted trapezoid.

Connection portions (corner portions in side view) of the engaging surfaces 61a and 61b and the upper base may be C-chamfered or R-chamfered. Furthermore, connection portions of the engaging surfaces 61a and 61b and the lower base (corner portions in side view) may also be C-chamfered or R-chamfered. In particular, as described later, if the connection portions of the engaging surfaces 61a and 61b and the lower base are C-chamfered or R-chamfered, then it is easy, when the coupling portion 61 is sealed with the sealing member 75, to fill the innermost recesses of the connection portions with the sealing member 75 without leaving a void or the like. This suppresses deterioration in adhesion between the sealing member 75 and the coupling portion 61. In addition, the upper base is not always parallel to the lower base. For example, the upper base may have the shape of a circular arc or be irregular.

Furthermore, the height of the coupling portion 61 may be less than that of the insulating plate 21b of the insulated circuit board 20b bonded to the cooling plate 60 with the solder 23. The width in the X direction of the upper base of the coupling portion 61 is approximately equal to the height of the coupling portion 61.

The coupling portion 61 may be formed at any position between the solder 23 under the insulated circuit board 20b and the frame portion 70a (adhesive 76) on the front surface S of the cooling plate 60. By forming the coupling portion 61 on the front surface S of the cooling plate 60 between the solder 23 under the insulated circuit board 20b and the frame portion 70a, the effect of the coupling portion 61 described later is obtained in the same way. In the first embodiment the coupling portion 61 is formed on the front surface S of the cooling plate 60 in a position which is nearer to the insulated circuit board 20b than to the frame portion 70a. To be concrete, it is assumed that an area of the cooling plate 60 just under (in the −Z direction of) an edge portion (on the side where the case 70 exists) of the insulating plate 21b is a point P. Then the coupling portion 61 is formed on the front surface S of the cooling plate 60 so that the engaging surface 61a will correspond to (be situated over) the point P in side view and in plan view. Furthermore, the coupling portion 61 is also formed on the front surface S of the cooling plate 60 so that the upper surface (corresponding to the engaging surface 61a) of the coupling portion 61 will be superimposed over the point P in plan view.

Furthermore, the coupling portion 61 may be formed on the front surface S of the cooling plate 60 so that the engaging surface 61b will be superimposed in stead of the engaging surface 61a over the point P in side view and in plan view. The coupling portion 61 need only be formed in side view between the frame portion 70a (adhesive 76) and the edge portion (corresponding to the point P) of the insulated circuit board 20b (insulating plate 21b) so that the engaging surface 61b will correspond to the point P.

For example, the above coupling portion 61 is bonded to the cooling plate 60 at a determined position by brazing. A material used for making the coupling portion 61 may be equal to or different from that used for making the cooling plate 60. A material having good adhesion to the sealing member 75 is selected for making the coupling portion 61.

When the sealing member 75 is poured over the cooling plate 60 having the front surface S on which the above coupling portion 61 is formed, the coupling portion 61 is sealed with the sealing member 75 and then the sealing member 75 is solidified. With the semiconductor device 10 stress is created due to the difference in linear expansion coefficient between members included in the semiconductor device 10 as a result of temperature cycling. In particular, stress tends to concentrate at corner portions in the case 70. Such stress causes the sealing member 75 to peel off the cooling plate 60. Furthermore, this peeling may extend.

With the semiconductor device 10 the engaging surfaces 61a and 61b of the coupling portion 61 sealed with the sealing member 75 are inclined. Accordingly, at this time the engaging surfaces 61a and 61b have an anchor effect on the sealing member 75. That is to say, the sealing member 75 which is going to peel in the +Z direction is controlled in the −Z direction by the engaging surfaces 61a and 61b of the coupling portion 61 which are inclined. The coupling portion 61 engages with the sealing member 75 by the engaging surfaces 61a and 61b. In particular, the coupling portion 61 of the semiconductor device 10 is formed so as to include the four corners of the cooling plate 60 in the case 70. This prevents the sealing member 75 from peeling off the cooling plate 60 in the semiconductor device 10. Furthermore, the coupling portion 61 also prevents peeling of the sealing member 75 from extending in the ±X direction. In order to prevent peeling of the sealing member 75, the coupling portion 61 is formed on a vacant area of the cooling plate 60 over which the insulated circuit boards 20a and 20b are mounted. The coupling portion 61 is not always continuous and may be formed so as to form the shape of a dashed line. Alternatively, the coupling portion 61 may be formed in plurality so that they will be arranged between the inner wall surfaces 70a1 through 70a4 of the case 70 and the insulated circuit boards 20a and 20b.

As stated above, the coupling portion 61 is formed on the front surface S of the cooling plate 60 so that the engaging surface 61a will correspond to (be situated over) the point P on the cooling plate 60. If the engaging surface 61a is nearer to the insulated circuit board 20b than the point P, then the distance between the insulated circuit board 20b and the coupling portion 61 (engaging surface 61a) is short and there may be a case where a space between the insulated circuit board 20b and the coupling portion 61 is not sufficiently filled with the sealing member 75. In this case, the insulation property of the insulated circuit board 20b may deteriorate and adhesion between the sealing member 75 and the coupling portion 61 may deteriorate.

Furthermore, it is assumed that the coupling portion 61 is formed on the front surface S of the cooling plate 60 so that it will be nearer to the frame portion 70a than to the insulated circuit board 20b. When peeling of the sealing member 75 occurs between the coupling portion 61 and the insulated circuit board 20b, this peeling may extend toward the insulated circuit board 20b. As a result, peeling of the solder 23 may occur.

The above semiconductor device 10 includes the semiconductor chips 30a, 30b, 40a, and 40b, the insulated circuit boards 20a and 20b, the cooling plate 60, the case 70, and the sealing member 75. The insulated circuit boards 20a and 20b include the insulating plates 21a and 21b, the circuit patterns 22a1 through 22a3 and 22b1 through 22b3 which are formed over the front surfaces of the insulating plates 21a and 21b and to which the semiconductor chips 30a and 40a and 30b and 40b are bonded, and the metal plates 23a and 23b formed on the back surfaces of the insulating plates 21a and 21b respectively. The insulated circuit boards 20a and 20b are bonded to the front surface S of the cooling plate 60 with the solder 23 therebetween. The case 70 is bonded to an outer edge portion of the front surface S with the adhesive 76 therebetween along the outer edge portion of the front surface S and surrounds the semiconductor chips 30a, 30b, 40a, and 40b and the insulated circuit boards 20a and 20b. The semiconductor chips 30a, 30b, 40a, and 40b and the insulated circuit boards 20a and 20b over the cooling plate 60 in the case 70 are sealed with the sealing member 75. Furthermore, with the semiconductor device 10 the cooling plate 60 has the coupling portion 61 including the engaging surfaces 61a and 61b which form a projection on the front surface S of the cooling plate 60 and which are inclined at an acute angle to the front surface S of the cooling plate 60. When the coupling portion 61 is sealed with the sealing member 75, the engaging surfaces 61a and 61b have an anchor effect on the sealing member 75. This prevents the sealing member 75 from peeling off the cooling plate 60. Accordingly, deterioration in the reliability of the semiconductor device 10 is prevented.

The above coupling portion 61 includes at least an engaging surface which is inclined to the front surface S of the cooling plate 60. Various modifications of the coupling portion 61 including such an engaging surface will now be described.

Modification 1-1

Various modifications of the coupling portion 61 will be described by the use of FIGS. 4A through 4G. FIGS. 4A through 4G are views of a coupling portion included in modification 1-1 of the semiconductor device according to the first embodiment. Each of FIGS. 4A through 4G is a sectional view of a coupling portion 61 corresponding to FIG. 3. As illustrated in FIG. 2, a coupling portion 61 illustrated in each of FIGS. 4A through 4G may be continuously formed on the front surface S of the cooling plate 60 along the frame portion 70a.

A coupling portion 61 illustrated in each of FIGS. 4A through 4G includes at least one engaging surface which is inclined at an acute angle to the front surface S of the cooling plate 60. A coupling portion 61 illustrated in FIG. 4A has the following shape. One of two coupling portions 61 illustrated in FIG. 3 is turned upside down and the other is put upon this one. That is to say, with the coupling portion 61 illustrated in FIG. 4A, a lower portion has the shape of a trapezoid and an upper portion has the shape of an inverted trapezoid. In this case, the coupling portion 61 includes a pair of engaging surfaces 61a and 61b. A coupling portion 61 illustrated in FIG. 4B has the following shape. In this case, one of two coupling portions 61 illustrated in FIG. 3 is also put upon the other. Both of a lower portion and an upper portion of the coupling portion 61 have the shape of an inverted trapezoid. Therefore, the coupling portion 61 illustrated in FIG. 4B includes two pairs of engaging surfaces 61a and 61b. With the coupling portion 61 illustrated in FIG. 4B, area (engagement area with the sealing member 75) inclined to the front surface S of the cooling plate 60 is large compared with the case of FIG. 3. This reliably prevents the sealing member 75 from peeling off the cooling plate 60, compared with the case of FIG. 3. With the coupling portion 61 illustrated in FIG. 4B, an inclination angle $\alpha$ of the engaging surfaces 61a and 61b of the upper portion is not always equal to an inclination angle $\alpha$ of the engaging surfaces 61a and 61b of the lower portion.

A coupling portion 61 illustrated in each of FIGS. 4C through 4E includes an engaging surface 61a and a side portion 61a1 opposite the engaging surface 61a. The coupling portion 61 illustrated in FIG. 4C includes an engaging surface 61a on only one side and is rectangular. The coupling portion 61 illustrated in FIG. 4D has the following shape. One of two coupling portions 61 illustrated in FIG. 4C is turned upside down and the other is put upon this one. That is to say, with the coupling portion 61 illustrated in FIG. 4D, a lower portion has a shape obtained by inverting the coupling portion 61 illustrated in FIG. 4C and an upper portion has the shape of the coupling portion 61 illustrated in FIG. 4C. The coupling portion 61 illustrated in FIG. 4E has the following shape. One of two coupling portions 61 illustrated in FIG. 4C is put upon the other. With the coupling portion 61 illustrated in FIG. 4E, an inclination angle $\alpha$ of the engaging surface 61a of the upper portion is not always equal to an inclination angle $\alpha$ of the engaging surface 61a of the lower portion. With the coupling portion 61 illustrated in each of FIGS. 4C through 4E, the side portion 61a1 extends perpendicularly to the front surface S of the cooling plate 60. That is to say, the side portion 61a1 forms an angle of 90° with the front surface S of the cooling plate 60. Furthermore, the coupling portion 61 illustrated in each of FIGS. 4C through 4E may face a laterally inverted direction.

A coupling portion 61 illustrated in FIG. 4F has the shape of a rhombus. That is to say, the coupling portion 61 illustrated in FIG. 4F includes an engaging surface 61a and a side portion 61a1 opposite the engaging surface 61a. A coupling portion 61 illustrated in FIG. 4G is triangular. That is to say, the coupling portion 61 illustrated in FIG. 4G also includes an engaging surface 61a. Furthermore, in FIG. 4F the engaging surface 61a is inclined at an inclination angle $\alpha$. In each of FIGS. 4F and 4G, the side portion 61a1 opposite the engaging surface 61a is inclined at an inclination angle $\beta$ to the front surface S of the cooling plate 60. At this time the inclination angle $\beta$ is an obtuse angle.

Modification 1-2

Figure 5:
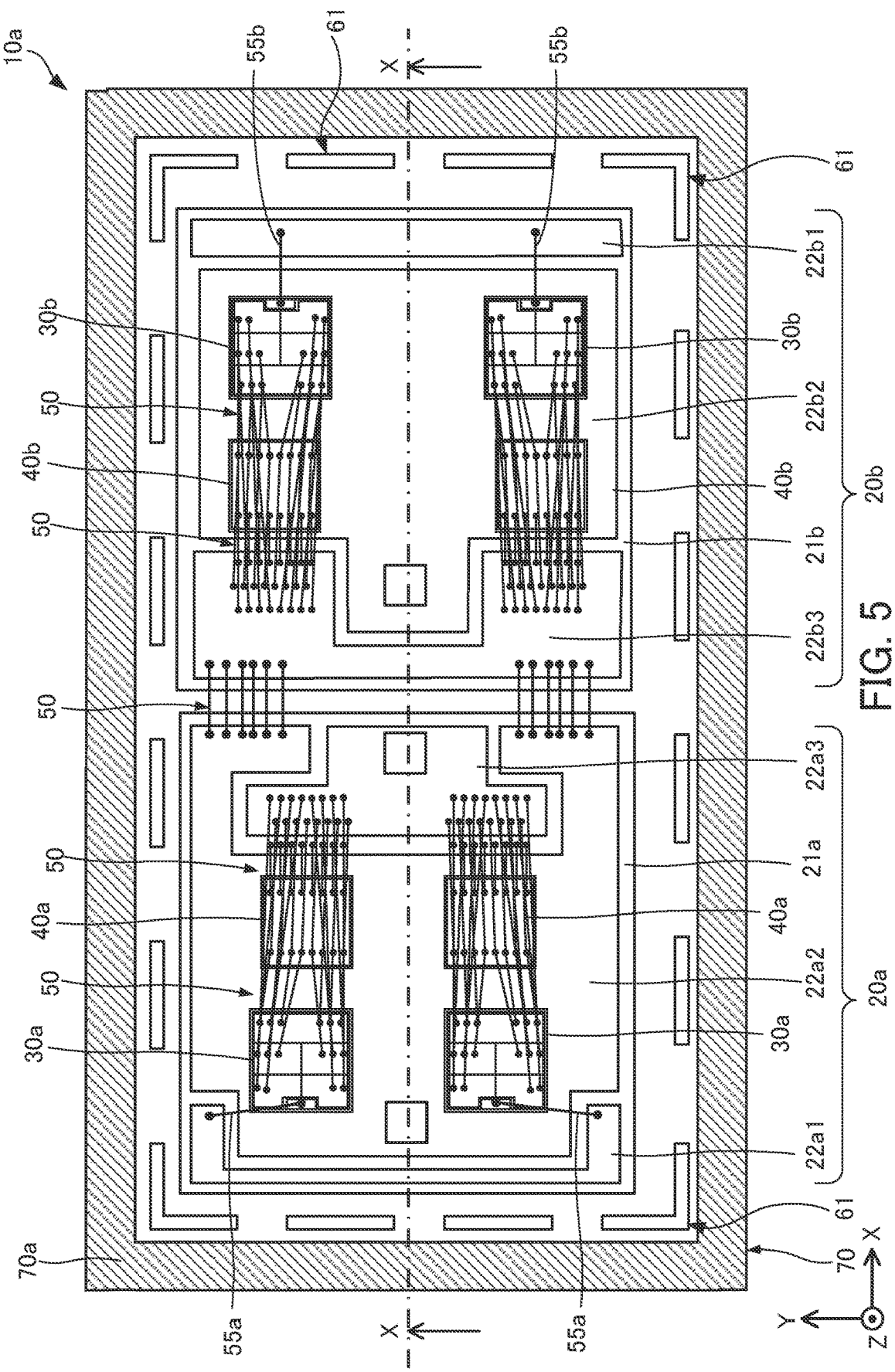
FIG. 5 is a plan view of modification 1-2 of the semiconductor device according to the first embodiment.

In modification 1-2 a case where a coupling portion 61 is formed on a front surface S of a cooling plate 60 surrounded by a case 70 so as to form the shape of a dashed line will be described by the use of FIG. 5. FIG. 5 is a plan view of modification 1-2 of the semiconductor device according to the first embodiment. FIG. 5 corresponds to the plan view of FIG. 2 and components except the coupling portion 61 illustrated in FIG. 5 are the same as those included in the semiconductor device 10 according to the first embodiment.

The coupling portion 61 is formed on the front surface S of the cooling plate 60 of a semiconductor device 10a surrounded by the case 70. In this case, the coupling portion 61 is formed on the front surface S of the cooling plate 60 so as to form the shape of a dashed line.

As stated above, stress tends to concentrate particularly at corner portions in the case 70 due to the difference in linear expansion coefficient between members included in the semiconductor device 10a as a result of temperature cycling. Accordingly, it is desirable that the coupling portion 61 in the shape of a dashed line include at least parts formed over corner portions of the front surface S of the cooling plate 60 surrounded by the case 70. As long as the coupling portion 61 is formed over the corner portions of the front surface S of the cooling plate 60 surrounded by the case 70, the coupling portion 61 may properly be formed along the long sides and the short sides of the cooling plate 60. Side portions adjacent to each other of the coupling portion 61 in the shape of a dashed line are also sealed with a sealing member 75. Furthermore, not only engaging surfaces 61a and 61b but also side portions adjacent to each other of the coupling portion 61 in the shape of a dashed line may be inclined at an acute angle to the front surface S of the cooling plate 60. If the coupling portion 61 is sealed with the sealing member 75, then not only the engaging surfaces 61a and 61b but also the inclined side portions have an anchor effect on the sealing member 75. As a result, it becomes easier to obtain the effect of preventing the sealing member 75 from peeling off the cooling plate 60

Modification 1-3

Figure 6:
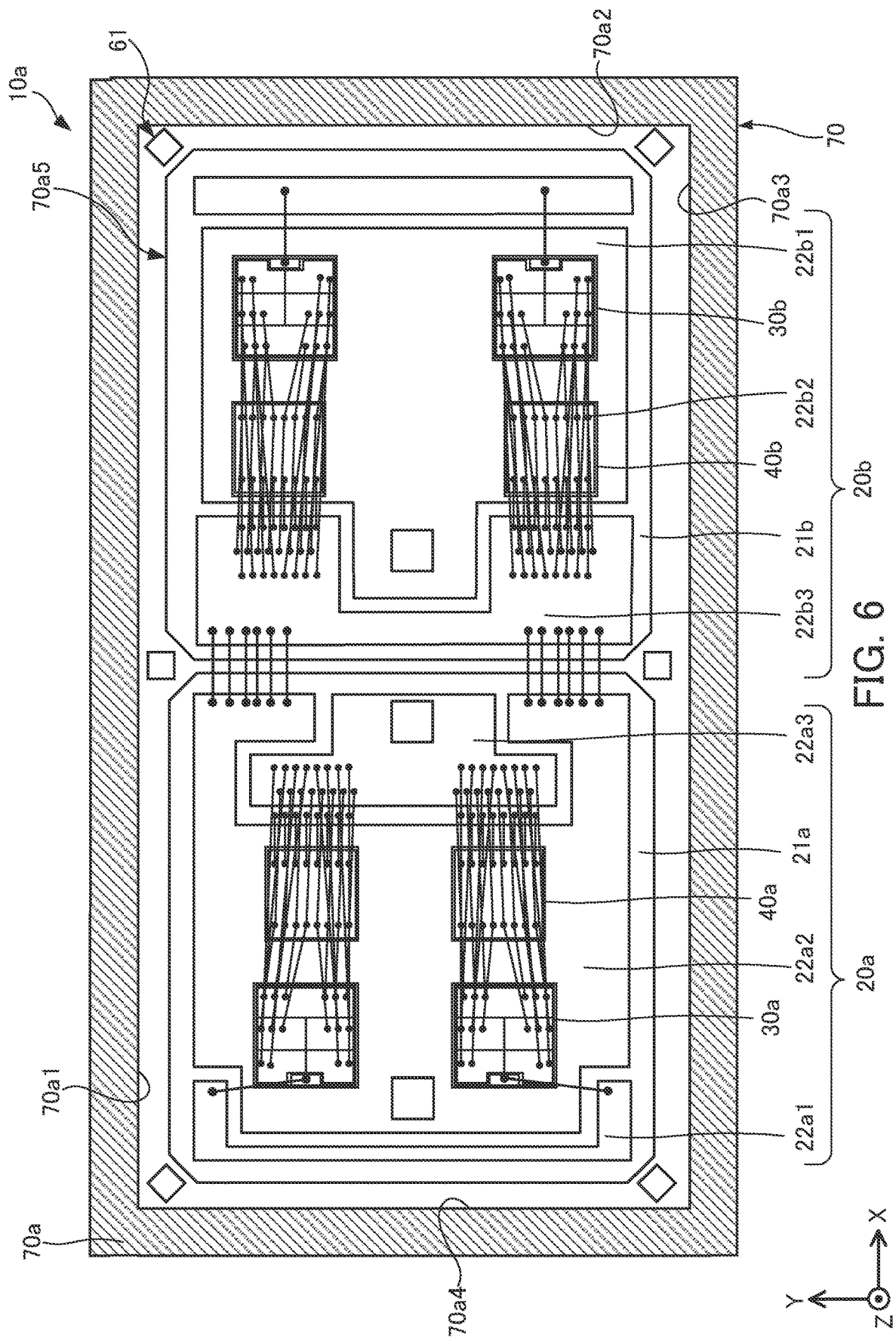
FIG. 6 is a plan view of modification 1-3 of the semiconductor device according to the first embodiment.

In modification 1-3 a case where coupling portions 61 are formed at four corners of each of the insulated circuit boards 20a and 20b of the semiconductor device 10 illustrated in FIGS. 1 and 2 will be described by the use of FIG. 6. FIG. 6 is a plan view of modification 1-3 of the semiconductor device according to the first embodiment. FIG. 6 corresponds to the plan view of FIG. 2 and components except the coupling portions 61 and insulating plates 21a and 21b illustrated in FIG. 6 are the same as those included in the semiconductor device 10 according to the first embodiment.

With a semiconductor device 10a the four corners of each of the insulating plates 21a and 21b of the semiconductor device 10 are chamfered. For example, the four corners of each of the insulating plates 21a and 21b of the semiconductor device 10 may be C-chamfered. The coupling portions 61 are formed in plan view on areas corresponding to the chamfered four corners of each of the insulating plates 21a and 21b. Note that the coupling portions 61 are formed one at each area corresponding to adjacent corner portions of the insulating plates 21a and 21b. The coupling portions 61 need only be formed at, at least, corner portions of the insulating plates 21a and 21b which face the corner portions of the case 70.

In particular, each of coupling portions 61 formed at the corner portions of the case 70 and corner portions of the insulating plates 21a and 21b includes at least one of engaging surfaces 61a and 61b. Furthermore, each coupling portion 61 may be formed so that the engaging surface 61a or 61b will face a corner portion of the case 70 or a chamfered corner portion of the insulating plate 21a or 21b.

As stated above, stress also tends to concentrate at corner portions in the case 70 of the semiconductor device 10a and the sealing member 75 tends to peel at the corner portions. With the semiconductor device 10a illustrated in FIG. 6, coupling portions 61 are formed at, at least, corner portions in the case 70 and chamfered corner portions of the insulating plates 21a and 21b. With the semiconductor device 10a these coupling portions 61 prevent peeling of the sealing member 75 at corner portions in the case 70. Furthermore, with the semiconductor device 10a the coupling portions 61 are formed at the chamfered corner portions of the insulating plates 21a and 21b. This suppresses peeling of the sealing member 75 while miniaturizing the semiconductor device 10a.

Modification 1-4

Figure 7:
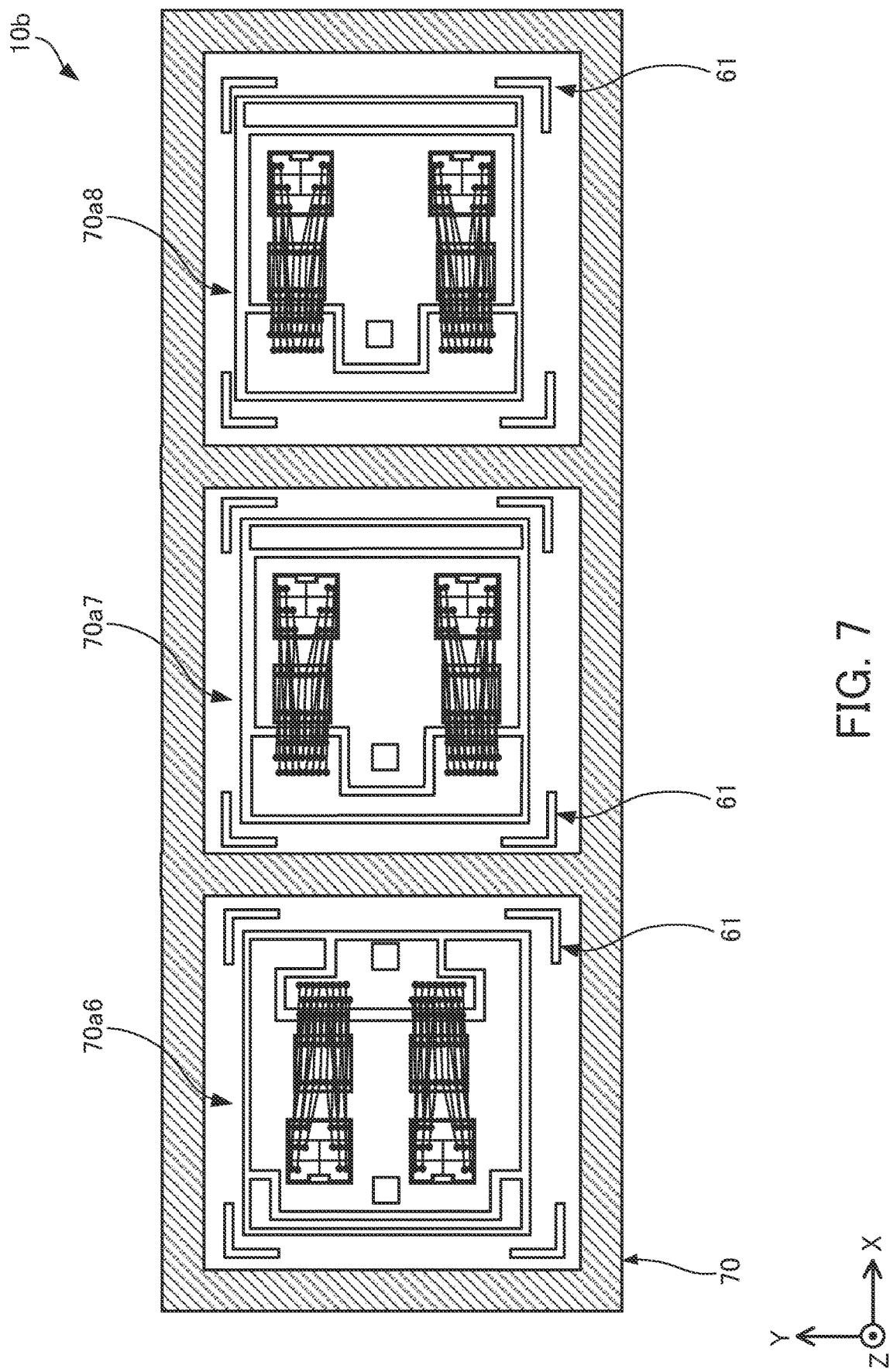
FIG. 7 is a plan view of modification 1-4 of the semiconductor device according to the first embodiment (part 1)
Figure 8:
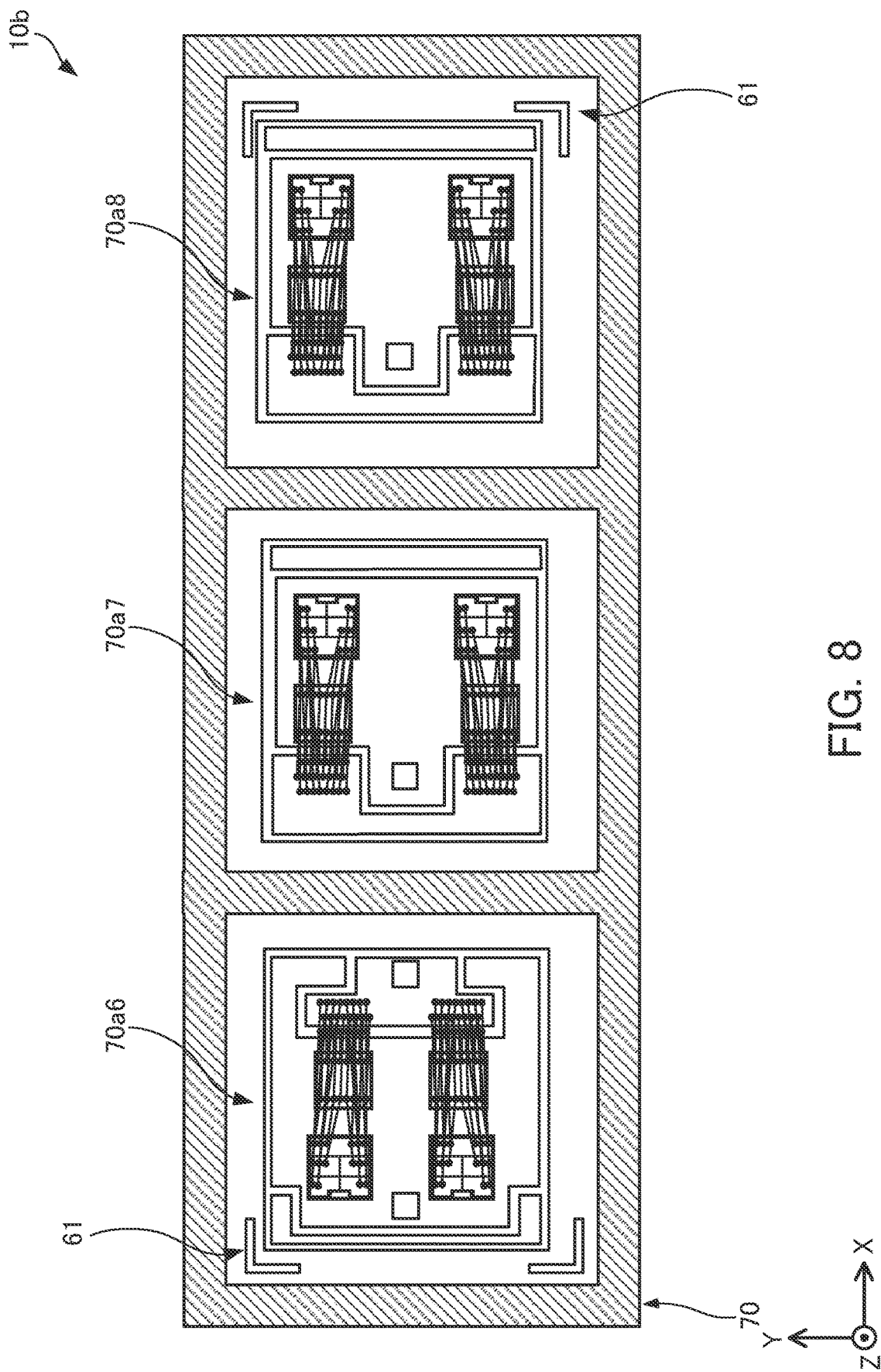
FIG. 8 is a plan view of modification 1-4 of the semiconductor device according to the first embodiment (part 2)

In modification 1-4 coupling portions 61 formed in a case where a case 70 is divided into a plurality of parts will be described by the use of FIG. 7 and FIG. 8. FIGS. 7 and 8 are plan views of modification 1-4 of the semiconductor device according to the first embodiment. In FIGS. 7 and 8 only components needed for giving description are marked with numerals. FIGS. 1 and 2 are referred to for components included in a semiconductor device 10b.

A case 70 of the semiconductor device 10b illustrated in each of FIGS. 7 and 8 is divided into three housing areas 70a6, 70a7, and 70a8 in the X direction. An insulated circuit board is arranged in each of the housing areas 70a6, 70a7, and 70a8 obtained by dividing the case 70 of the semiconductor device 10b. As stated above, stress also tends to concentrate particularly at corner portions in the case 70 due to the difference in linear expansion coefficient between members included in the semiconductor device 10b as a result of temperature cycling. Accordingly, with the semiconductor device 10b illustrated in FIG. 7, a coupling portion 61 is formed at each corner portion of the housing areas 70a6, 70a7, and 70a8. In this case, as with modification 1-2, a coupling portion 61 may be formed not only at each corner portion of the housing areas 70a6, 70a7, and 70a8 but also at each portion along the long sides and the short sides of the housing areas 70a6, 70a7, and 70a8 so as to form the shape of a dashed line.

Furthermore, with the semiconductor device 10b illustrated in FIG. 8, a coupling portion 61 is formed only at each corner portion of the entire case 70. In this case, as with modification 1-2, a coupling portion 61 may be formed not only at each corner portion of the entire case 70 but also at each portion along the long sides and the short sides of a cooling plate 60 so as to form the shape of a dashed line.

As described in modification 1-2, with the coupling portions 61 illustrated in each of FIGS. 7 and 8, not only engaging surfaces 61a and 61b but also side portions adjacent to each other may be inclined at an acute angle to the front surface S of the cooling plate 60.

Second Embodiment

Figure 9:
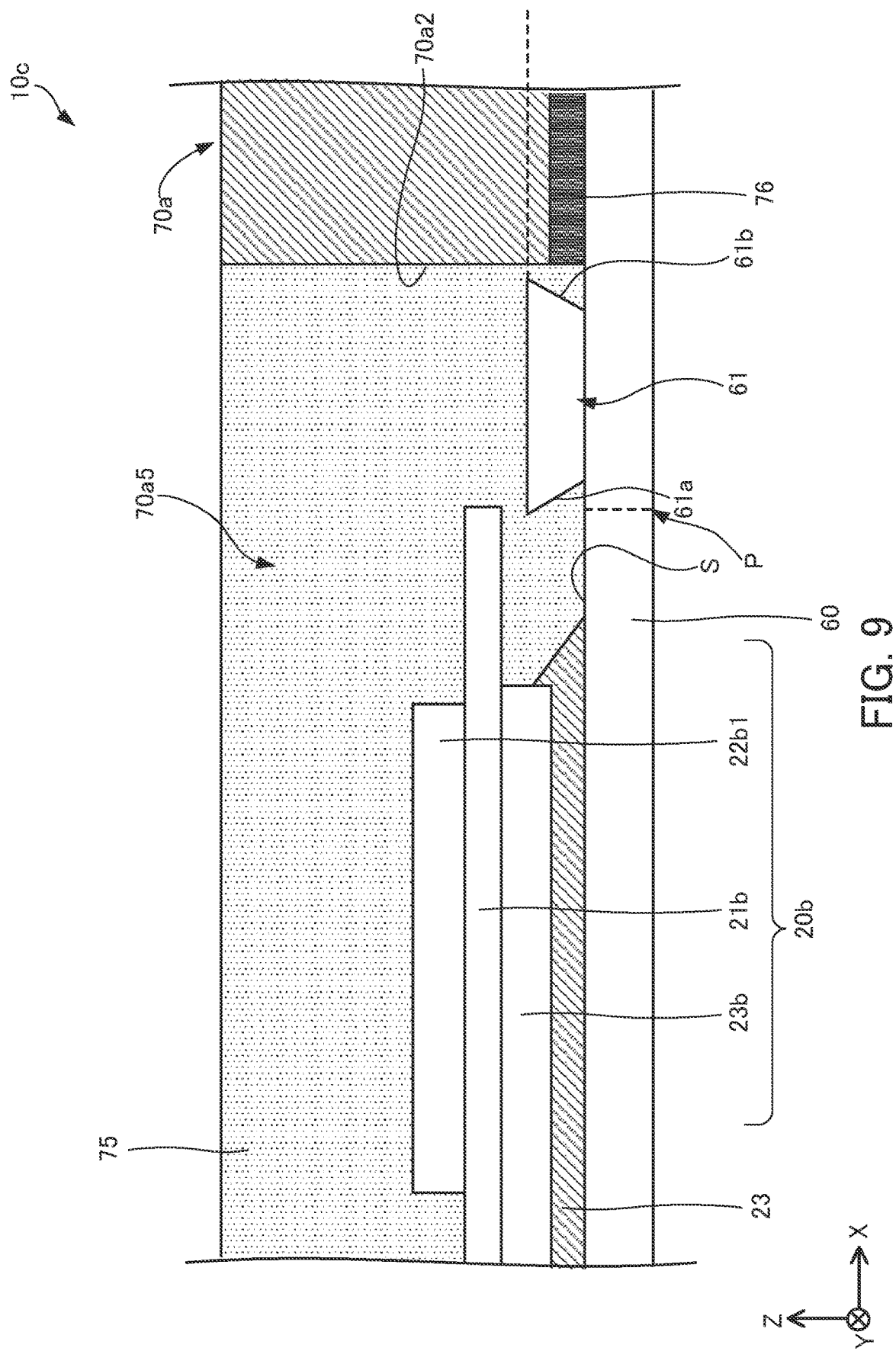
FIG. 9 is a fragmentary sectional side elevation view of a semiconductor device according to a second embodiment.

In a second embodiment a case where an engaging surface 61b (side portion) of a coupling portion 61 is in close proximity to a case 70 will be described by the use of FIG. 9. FIG. 9 is a fragmentary sectional side elevation view of a semiconductor device according to a second embodiment. Components except the coupling portion 61 included in a semiconductor device 10c according to a second embodiment are the same as those included in the semiconductor device 10 according to the first embodiment. Furthermore, FIG. 9 corresponds to the sectional view of FIG. 3.

The coupling portion 61 of the semiconductor device 10c is formed on a front surface S of a cooling plate 60 between an insulated circuit board 20b and a frame portion 70a of the case 70. The coupling portion 61 includes an engaging surface 61a and an engaging surface 61b (side portion) opposite to the engaging surface 61a. Furthermore, the width in the X direction of the coupling portion 61 is greater than that of the coupling portion 61 in the first embodiment. As with the first embodiment, the engaging surface 61a is located in side view in a position corresponding to a point P. The engaging surface 61b is located so as to be in close proximity to an inner wall surface 70a2 of the frame portion 70a. The distance between the engaging surface 61b and the inner wall surface 70a2 of the frame portion 70a is greater than or equal to 0.8 times the height of the coupling portion 61 from the front surface S of the cooling plate 60 and smaller than or equal to 1.2 times the height of the coupling portion 61 from the front surface S of the cooling plate 60.

Alternatively, the engaging surface 61b may be in contact with the inner wall surface 70a2 of the frame portion 70a. That is to say, the coupling portion 61 is formed on the front surface S of the cooling plate 60 so that an upper end in the +Z direction (on the side farther from the front surface S of the cooling plate 60) of the engaging surface 61b will be in contact with the inner wall surface 70a2 of the frame portion 70a in side view. The upper end of the engaging surface 61b corresponds to a disposition area of the frame portion 70a in plan view. The coupling portion 61 (engaging surface 61b) functions as a positioner at the time of fixing the frame portion 70a. On the other hand, a lower end in the −Z direction (on the side where the front surface S of the cooling plate 60 exists) of the engaging surface 61b may be situated so that the distance between the lower portion of the engaging surface 61b and the inner wall surface 70a2 of the frame portion 70a will be shorter than or equal to five times the thickness of an adhesive 76. As described later, this suppresses protrusion of the adhesive 76.

The height of the coupling portion 61 means the length in the vertical direction (in the +Z direction) from the front surface S of the cooling plate 60. As with the first embodiment, the height of the coupling portion 61 is less than that of an insulating plate 21b of an insulated circuit board 20b. Furthermore, the height of the coupling portion 61 may be greater than the thickness of the adhesive 76.

As with the first embodiment, the engaging surface 61b is inclined. However, for example, the engaging surface 61b may be perpendicular to the front surface S of the cooling plate 60. That is to say, the engaging surface 61b may be approximately parallel to the inner wall surface 70a2 of the frame portion 70a. As with the first embodiment, the coupling portion 61 is also formed continuously on the front surface S of the cooling plate 60 surrounded by the case 70.

By the way, a case where the coupling portion 61 is not formed will be considered. When the case 70 (frame portion 70a) is fixed to the cooling plate 60 in the semiconductor device 10c with the adhesive 76 therebetween, the adhesive 76 with which the frame portion 70a and the cooling plate 60 are bonded together may partially protrude toward a housing area 70a5. When the inside of the case 70 is sealed with a sealing member 75 in a state in which the adhesive 76 is protruding, a protruding portion of the adhesive 76 is also sealed with the sealing member 75. However, the sealing member 75 may peel with the protruding portion of the adhesive 76 as a starting point. Peeling of the sealing member 75 may extend from the inner wall surface 70a2 of the frame portion 70a to the insulated circuit board 20b. If peeling of the sealing member 75 extends further, then it may reach a solder 23. As a result, the solder 23 may peel.

To deal with this, with the semiconductor device 10c the coupling portion 61 is formed on the cooling plate 60. As with the first embodiment, the coupling portion 61 has an anchor effect on the sealing member 75. This prevents the sealing member 75 from peeling off the cooling plate 60. Furthermore, the engaging surface 61b of the coupling portion 61 is in close proximity to the inner wall surface 70a2 of the frame portion 70a. This suppresses peeling of the sealing member 75, which occurs with the protruding portion of the adhesive 76 as a starting point and which extends from the inner wall surface 70a2 of the frame portion 70a to the insulated circuit board 20b, in the vicinity of the frame portion 70a. Because extension of peeling of the sealing member 75 is suppressed, peeling of the solder 23 is also suppressed. In addition, the engaging surface 61b is in close proximity to the inner wall surface 70a2 of the frame portion 70a. This prevents the adhesive 76 from protruding significantly. The occurrence of peeling of the sealing member 75 at the starting point is also prevented.

Modification 2-1

Figure 10:
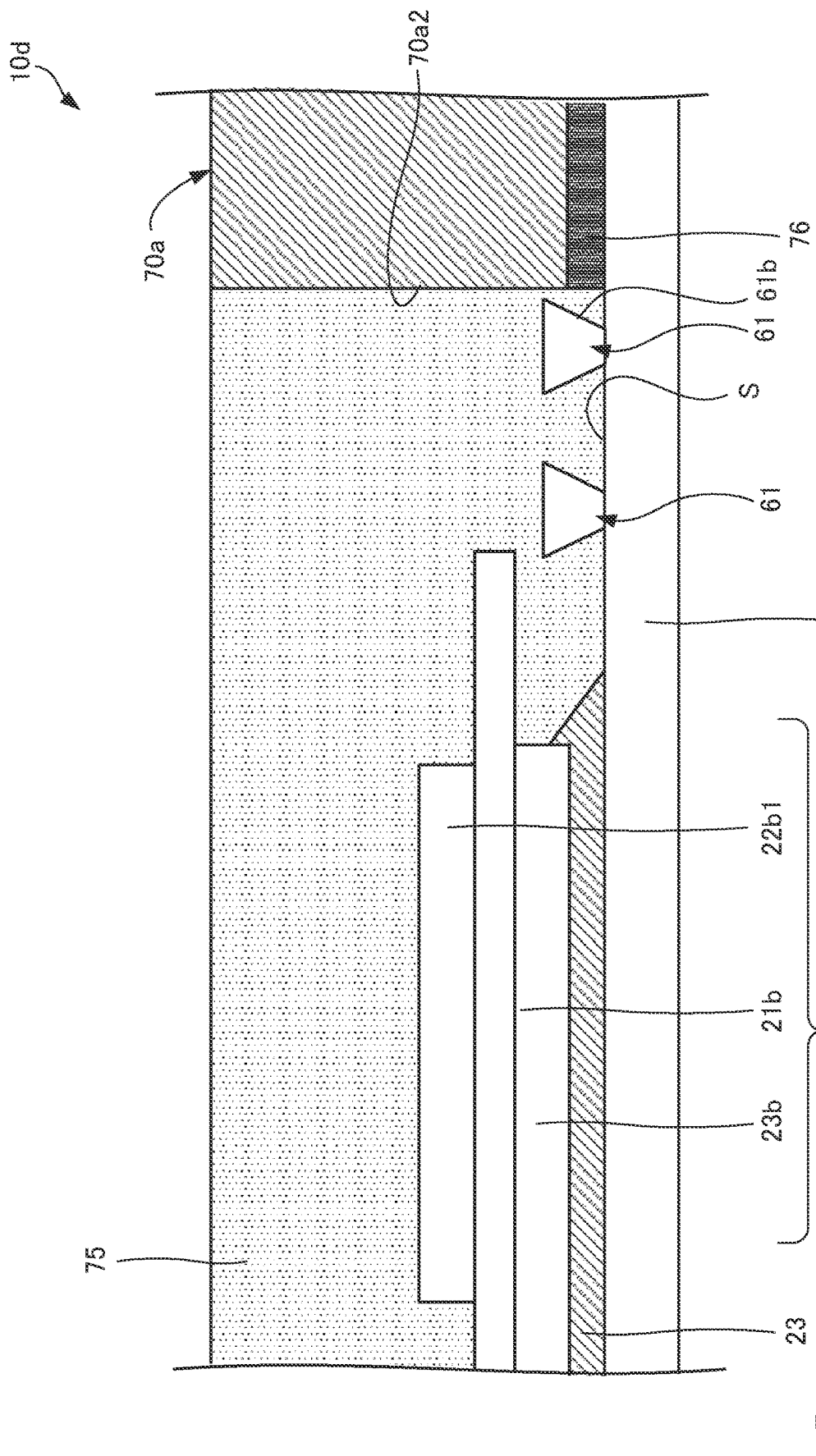
FIG. 10 is a fragmentary sectional side elevation view of modification 2-1 of the semiconductor device according to the second embodiment.

In modification 2-1 a modification of the second embodiment will be described by the use of FIG. 10. FIG. 10 is a fragmentary sectional side elevation view of modification 2-1 of the semiconductor device according to the second embodiment. Components except a coupling portion 61 included in a semiconductor device 10d according to modification 2-1 are also the same as those included in the semiconductor device 10 according to the first embodiment.

With the semiconductor device 10d another coupling portion 61 is additionally formed in the same way outside the coupling portion 61 in the semiconductor device 10 according to the first embodiment. As with the second embodiment, an engaging surface 61b of the outer additional coupling portion 61 is in close proximity to an inner wall surface 70a2 of a frame portion 70a. It may be that the engaging surface 61b of the additional coupling portion 61 will not be inclined. That is to say, the engaging surface 61b of the additional coupling portion 61 may be perpendicular to a front surface S of a cooling plate 60. Inclination angles of engaging surfaces 61a and 61b of the coupling portion 61 may be different from inclination angles of engaging surfaces 61a and 61b, respectively, of the additional coupling portion 61. The height of the coupling portion 61 may be different from that of the additional coupling portion 61.

As with the second embodiment, with the semiconductor device 10d peeling of a sealing member 75, which occurs with a protruding portion of an adhesive 76 as a starting point and which extends from an inner wall surface 70a2 of the frame portion 70a to an insulated circuit board 20b, is also suppressed in the vicinity of the frame portion 70a. Furthermore, with the semiconductor device 10d the quantity of the coupling portions 61 is larger than that of the coupling portion 61 in the first embodiment. This increases engagement area with the sealing member 75 and reliably prevents the sealing member 75 from peeling off the front surface S of the cooling plate 60.

Third Embodiment

Figure 11:
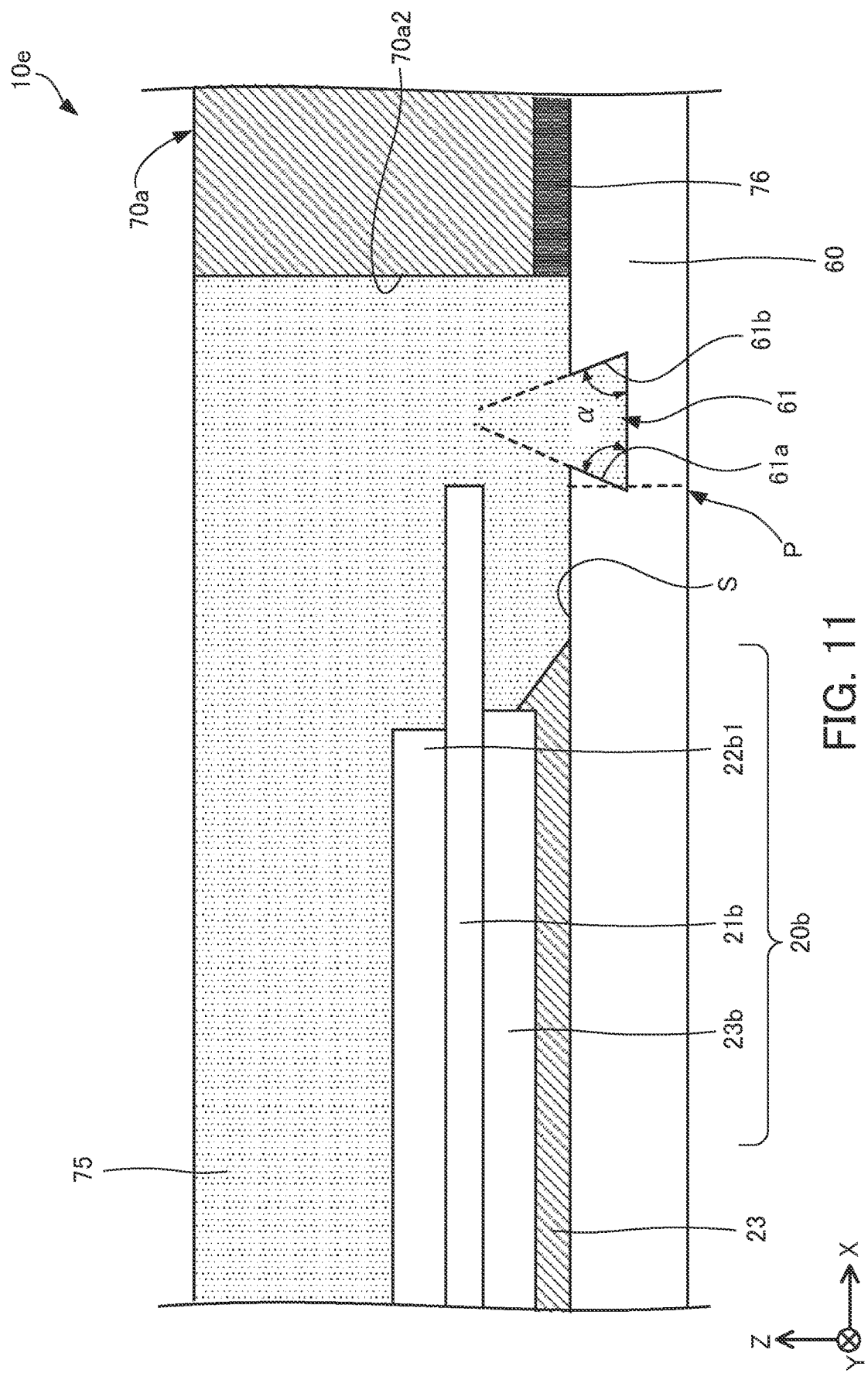
FIG. 11 is a fragmentary sectional side elevation view of a semiconductor device according to a third embodiment.
Figure 12:
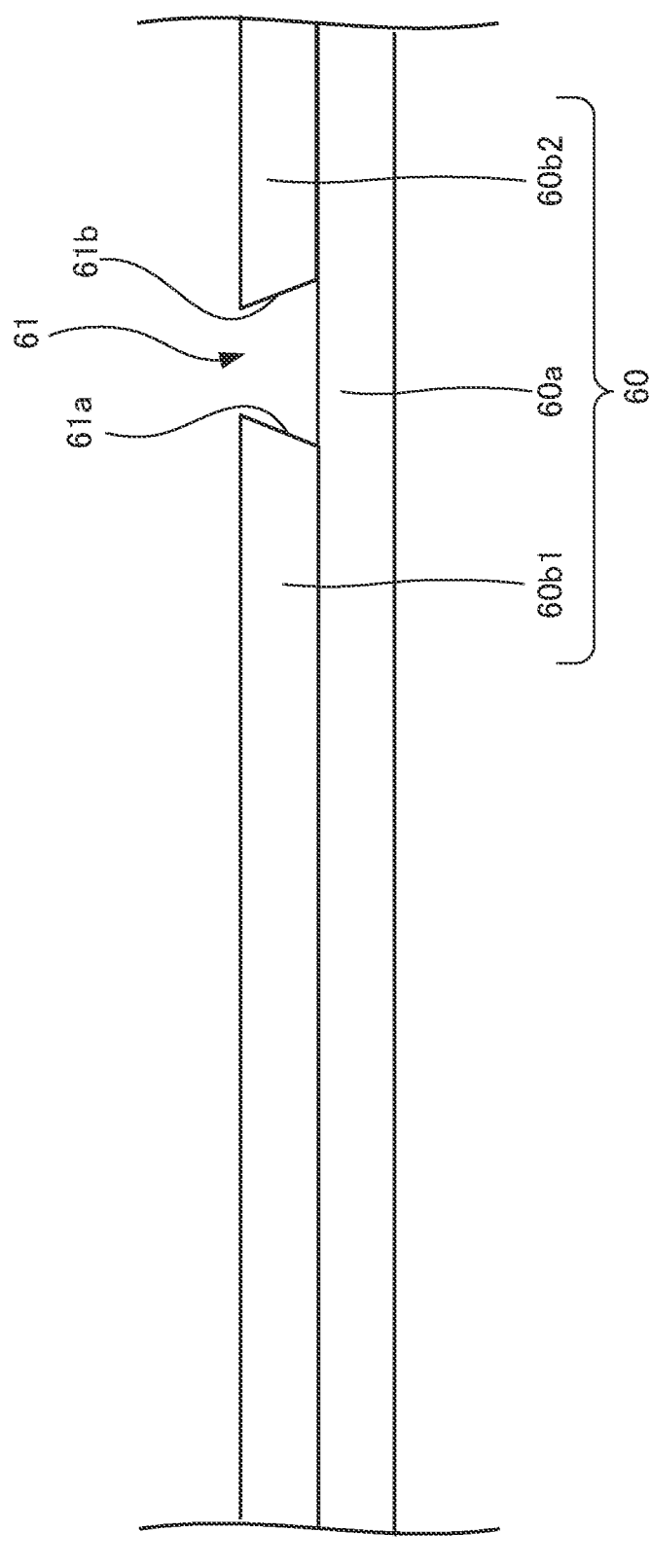
FIG. 12 is a fragmentary sectional side elevation view of a cooling plate included in the semiconductor device according to the third embodiment.

In a third embodiment a case where a coupling portion 61 is not a projection but a recess will be described by the use of FIG. 11 and FIG. 12. FIG. 11 is a fragmentary sectional side elevation view of a semiconductor device according to the third embodiment. FIG. 12 is a fragmentary sectional side elevation view of a cooling plate included in the semiconductor device according to the third embodiment. With a semiconductor device 10e according to the third embodiment the coupling portion 61 included in the semiconductor device 10 according to the first embodiment is formed so as to be recessed. The other components included in the semiconductor device 10e according to the third embodiment are the same as those included in the semiconductor device 10 according to the first embodiment. Furthermore, FIG. 11 corresponds to the sectional view of FIG. 3.

The coupling portion 61 is recessed with respect to a front surface S of a cooling plate 60 and includes engaging surfaces 61a and 61b which are inclined at an acute angle to the front surface S of the cooling plate 60. At least one of the engaging surfaces 61a and 61b of the coupling portion 61 need only be inclined. In the case of FIG. 11, the engaging surfaces 61a and 61b are inclined at the same angle (inclination angle α) to the front surface S of the cooling plate 60. Because the engaging surfaces 61a and 61b are inclined to the front surface S of the cooling plate 60, a section of the coupling portion 61 has the shape of a trapezoid.

The engaging surface 61a faces toward an inner wall surface 70a2 of a frame portion 70a in an opening and the engaging surface 61b faces toward an insulated circuit board 20b. Furthermore, the engaging surfaces 61a and 61b are inclined at an inclination angle α to the front surface S of the cooling plate 60. The inclination angle α is preferably greater than or equal to 45° and less than or equal to 80°. In addition, because the engaging surfaces 61a and 61b are equal in inclination angle α, the coupling portion 61 has the shape of a trapezoid. However, as long as inclination angles α of the engaging surfaces 61a and 61b are acute angles, they may be different from each other. In this case, a section of the coupling portion 61 does not have the shape of a trapezoid.

Connection portions (corner portions) of the engaging surfaces 61a and 61b and a base may be C-chamfered or R-chamfered. By doing so, as described later, when the coupling portion 61 is sealed with a sealing member 75, the innermost recesses of the connection portions are filled with the sealing member 75. In this case, a void or the like is not left. Accordingly, deterioration in adhesion between the sealing member 75 and the coupling portion 61 is suppressed. Furthermore, the base is not always parallel to the front surface S (X-Y plane) of the cooling plate 60. The base may have the shape of a circular arc or be irregular.

In addition, the depth of the coupling portion 61 is greater than or equal to 0.2 times the thickness of the cooling plate 60 and smaller than or equal to 0.5 times the thickness of the cooling plate 60. The width in the X direction of the lower base of the coupling portion 61 is greater than or equal to 1.0 time the depth of the coupling portion 61 and smaller than or equal to 5.0 times the depth of the coupling portion 61.

Furthermore, the coupling portion 61 formed in the front surface S of the cooling plate 60 is nearer to the insulated circuit board 20b than to the frame portion 70a. In particular, it is assumed that an area of the cooling plate 60 just under (in the −Z direction of) an edge portion (on the side where a case 70 exists) of an insulating plate 21b is a point P. Then the coupling portion 61 is formed in the front surface S of the cooling plate 60 so that the engaging surface 61a will correspond to the point P in side view. In addition, a recessed coupling portion 61 may be formed in place of the projecting coupling portion 61 illustrated in FIG. 2, FIG. 5, FIG. 6, FIG. 7, or FIG. 8.

For example, the above coupling portion 61 is formed in the following way. First a cooling plate 60a having the shape of a flat plate and cooling plates 60b1 and 60b2 on which tapered surfaces corresponding to the engaging surfaces 61a and 61b, respectively, are formed by tapering are prepared in advance. The cooling plate 60a is rectangular in plan view. The cooling plate 60b1 is rectangular and is smaller in size than the cooling plate 60a, in plan view. Furthermore, the cooling plate 60b2 has the shape of a frame in plan view and the size of the cooling plate 60b2 is such that the cooling plate 60b1 is surrounded by the cooling plate 60b2.

As illustrated in FIG. 12, the cooling plate 60b1 is located on the front surface of the cooling plate 60a. Furthermore, the cooling plate 60b2 is located on the cooling plate 60a with a determined distance kept between the engaging surface 61a of the cooling plate 60b1 and the engaging surface 61b of the cooling plate 60b2. The cooling plates 60b1 and 60b2 are bonded to the cooling plate 60a by brazing. As a result, the cooling plate 60 in which the recessed coupling portion 61 is formed is obtained.

When the sealing member 75 is poured over the cooling plate 60 having the front surface S in which the coupling portion 61 is formed in this way, the coupling portion 61 is sealed with the sealing member 75 and then the sealing member 75 is solidified. With the semiconductor device 10e the engaging surfaces 61a and 61b of the coupling portion 61 sealed with the sealing member 75 are inclined. Accordingly, the engaging surfaces 61a and 61b have an anchor effect on the sealing member 75. That is to say, the sealing member 75 which is going to peel in the +Z direction is controlled in the −Z direction by the engaging surfaces 61a and 61b of the coupling portion 61 which are inclined. The coupling portion 61 engages with the sealing member 75 by the engaging surfaces 61a and 61b. In particular, the coupling portion 61 of the semiconductor device 10e is also formed so as to include the four corners of the cooling plate 60 in the case 70. This prevents the sealing member 75 from peeling off the cooling plate 60 in the semiconductor device 10e. In order to prevent peeling of the sealing member 75, the coupling portion 61 is formed on a vacant area of the cooling plate 60 over which the insulated circuit boards 20a and 20b are mounted. Furthermore, the coupling portion 61 is not always continuous and may be formed so as to form the shape of a dashed line. Alternatively, the coupling portion 61 may be formed in plurality. For example, the coupling portion 61 may be formed doubly or triply.

Modification 3-1

Various modifications of the coupling portion 61 will be described by the use of FIGS. 13A through 13E. FIGS. 13A through 13E are views of a coupling portion included in modification 3-1 of the semiconductor device according to the third embodiment. Each of FIGS. 13A through 13E is a sectional view of a coupling portion 61 corresponding to FIG. 11. A coupling portion 61 illustrated in each of FIGS. 13A through 13E is formed continuously or in the shape of a dashed line in a front surface S of a cooling plate 60 along a frame portion 70a.

Figure 13B:
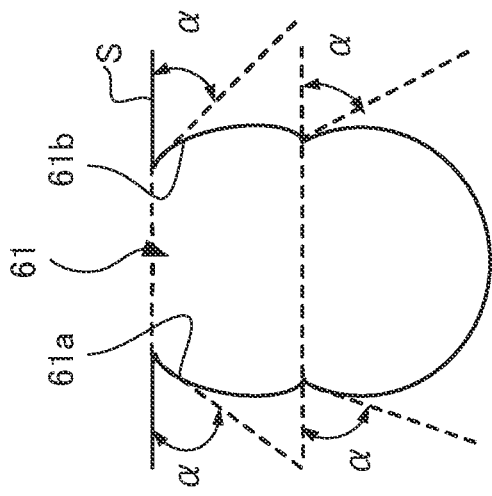
FIGS. 13A through 13E are views of a coupling portion included in modification 3-1 of the semiconductor device according to the third embodiment.
Figure 13A:
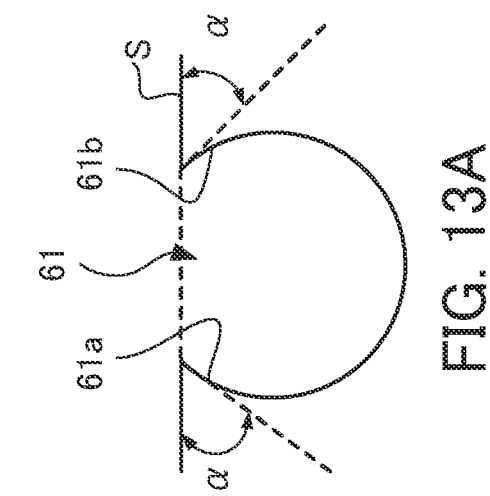

A coupling portion 61 illustrated in each of FIGS. 13A through 13E is formed in the front surface S of the cooling plate 60 by etching so as to be recessed. Furthermore, a coupling portion 61 illustrated in each of FIGS. 13A through 13E includes at least one engaging surface which is inclined at an acute angle in side view. The coupling portion 61 illustrated in FIG. 13A includes engaging surfaces 61a and 61b and is concave, in side view. The coupling portion 61 illustrated in FIG. 13B has the following shape. One of two coupling portions 61 illustrated in FIG. 13A is put upon the other. Therefore, the coupling portion 61 illustrated in FIG. 13B includes two pairs of engaging surfaces 61a and 61b. With the coupling portion 61 illustrated in FIG. 13B, area (engagement area with a sealing member 75) inclined to the front surface S of the cooling plate 60 is large compared with the case of FIG. 13A. This reliably prevents the sealing member 75 from peeling off the cooling plate 60, compared with the case of FIG. 13A. With the coupling portion 61 illustrated in FIG. 13B, an inclination angle α of the engaging surfaces 61a and 61b of the upper portion is not always equal to an inclination angle α of the engaging surfaces 61a and 61b of the lower portion.

Figure 13C:
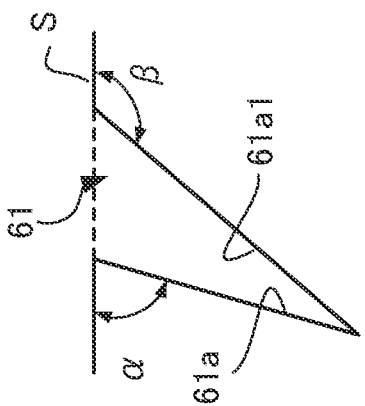
Figure 13D:
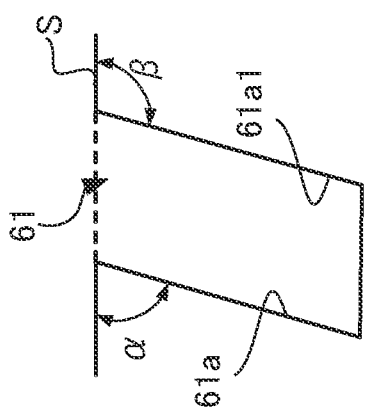
Figure 13E:
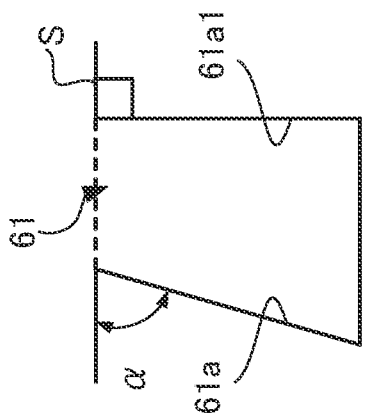

A coupling portion 61 illustrated in each of FIGS. 13C through 13E includes an engaging surface 61a and a side portion 61a1 opposite the engaging surface 61a. The coupling portion 61 illustrated in FIG. 13C includes an engaging surface 61a on only one side and is rectangular. In FIG. 13C the side portion 61a1 extends perpendicularly to the front surface S of the cooling plate 60. That is to say, the side portion 61a1 forms an angle of 90° with the front surface S of the cooling plate 60. The coupling portion 61 illustrated in FIG. 13D has the shape of a rhombus. That is to say, the coupling portion 61 illustrated in FIG. 13D includes an engaging surface 61a and a side portion 61a1 opposite the engaging surface 61a. The coupling portion 61 illustrated in FIG. 13E is triangular. That is to say, the coupling portion 61 illustrated in FIG. 13E also includes an engaging surface 61a. Furthermore, in FIG. 13D or 13E, the engaging surface 61a is inclined at an inclination angle α. In each of FIGS. 13D and 13E, the side portion 61a1 is inclined at an inclination angle β to the front surface S of the cooling plate 60. At this time the inclination angle β is an obtuse angle. In addition, the coupling portion 61 illustrated in each of FIGS. 13C through 13E may face a laterally inverted direction.

The disclosed techniques prevent a sealing member from peeling off a cooling plate and suppress deterioration in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor chip;
   an insulated circuit board including an insulating plate, a circuit pattern disposed on a first front surface of the insulating plate, and a metal plate disposed on a back surface of the insulating plate, the semiconductor chip being disposed on the first front surface of the insulating plate;
   a cooling plate having a second front surface on which the insulated circuit board is disposed;
   a bonding member which bonds the insulated circuit board to the cooling plate;
   a case which is disposed along an outer edge portion of the second front surface of the cooling plate to surround the semiconductor chip and the insulated circuit board, and is bonded to the cooling plate by an adhesive therebetween; and
   a sealing member which seals the semiconductor chip and the insulated circuit board on the cooling plate in the case,
   wherein the cooling plate has a coupling portion that includes a projection disposed away from the bonding member at the second front surface of the cooling plate, the coupling portion having an engaging surface that is inclined to form an acute angle with the second front surface of the cooling plate, and
   wherein in a plan view of the semiconductor device, the engaging surface is located directly below an edge of the insulating plate that is closest to the engaging surface.

2. The semiconductor device according to claim 1, wherein the coupling portion is disposed on the second front surface of the cooling plate between the bonding member and the case.

3. The semiconductor device according to claim 2, wherein
   the engaging surface is provided in plurality, and
   the coupling portion is disposed on the second front surface of the cooling plate such that an engaging surface among the plurality of engaging surfaces of the coupling portion, that is closer to the case than is any other of the plurality of engaging surfaces of the coupling portion is located between the case and an edge of the insulated circuit board at a side facing the case in a plan view of the semiconductor device.

4. The semiconductor device according to claim 3, wherein the coupling portion is disposed on the second front surface of the cooling plate such that an engaging surface that is closer to the bonding member than is any other engaging surface of the coupling portion is located between the case and the edge of the insulated circuit board at the side facing the case in the plan view.

5. The semiconductor device according to claim 1, wherein the engaging surface of the coupling portion is provided in plurality and includes a first engaging surface which faces the insulated circuit board.

6. The semiconductor device according to claim 5, wherein the plurality of engaging surfaces of the coupling portion includes a second engaging surface which faces the case.

7. The semiconductor device according to claim 5, wherein an inclination angle of the first engaging surface to the second front surface of the cooling plate is in a range of 45° to 80°.

8. The semiconductor device according to claim 1, wherein the engaging surface of the coupling portion is provided in plurality and includes a second engaging surface which faces the case.

9. The semiconductor device according to claim 8, wherein the second engaging surface of the coupling portion is in close proximity to the case.

10. The semiconductor device according to claim 9, wherein an upper end of the second engaging surface at a side opposite to a side contacting the front surface of the cooling plate is in contact with an inner wall surface of the case.

11. The semiconductor device according to claim 9, wherein a lower end of the second engaging surface at a side contacting the front surface of the cooling plate is positioned at a distance from an inner wall surface of the case shorter than or equal to five times a thickness of the adhesive.

12. The semiconductor device according to claim 9, wherein a height of the second engaging surface measured from the front surface of the cooling plate is greater than or equal to a thickness of the adhesive and is less than a height of the insulating plate.

13. The semiconductor device according to claim 12, wherein a part of the coupling portion is disposed in a plan view of the semiconductor device at a corner of the cooling plate adjacent to the case.

14. The semiconductor device according to claim 1, wherein the engaging surface of the coupling portion faces an edge of the insulating plate of the insulated circuit board.

15. The semiconductor device according to claim 1, wherein the coupling portion extends on the cooling plate along the case.

16. The semiconductor device according to claim 15, wherein, in the plan view, the coupling portion is continuous along the case on the cooling plate.

17. The semiconductor device according to claim 15, wherein, in the plan view, the coupling portion extends on the cooling plate along the case in a shape of a dashed line.

18. The semiconductor device according to claim 1, wherein:
    the insulated circuit board has a rectangular shape and has corner portions that are chamfered in a plan view of the semiconductor device; and
    the coupling portion is provided in plurality and respective coupling portions of the plurality of coupling portions are disposed at areas on the front surface of the cooling plate corresponding to chamfered areas at the corner portions of the insulated circuit board in the plan view of the semiconductor device.

19. A semiconductor device, comprising:
    a semiconductor chip;
    an insulated circuit board including an insulating plate, a circuit pattern disposed on a first front surface of the insulating plate, and a metal plate disposed on a back surface of the insulating plate, the semiconductor chip being disposed on the first front surface of the insulating plate;
    a cooling plate having a second front surface on which the insulated circuit board is disposed;

a bonding member which bonds the insulated circuit board to the cooling plate;

a case which is disposed along an outer edge portion of the second front surface of the cooling plate to surround the semiconductor chip and the insulated circuit board, and is bonded to the cooling plate by an adhesive therebetween; and a sealing member which seals the semiconductor chip and the insulated circuit board on the cooling plate in the case, wherein the cooling plate has a coupling portion that includes a recess disposed away from the bonding member in the second front surface of the cooling plate, the coupling portion having an engaging surface that is inclined to form an acute angle with the second front surface of the cooling plate, and wherein in a plan view of the semiconductor device, the engaging surface is located directly below an edge of the insulating plate that is closest to the engaging surface.

\* \* \* \* \*